(12) United States Patent
Motzer et al.

(10) Patent No.: US 11,287,507 B2
(45) Date of Patent: Mar. 29, 2022

(54) SYSTEM AND METHOD FOR TESTING A STRUCTURE USING LASER ULTRASOUND

(71) Applicant: The Boeing Company, Chicago, IL (US)

(72) Inventors: William P. Motzer, Mt. Pleasant, SC (US); Gary E. Georgeson, Tacoma, WA (US); Jill P. Bingham, Seattle, WA (US); James C. Kennedy, Summerville, SC (US); Jeffry J. Garvey, Charleston, SC (US)

(73) Assignee: The Boeing Company, Chicago, IL (US)

( * ) Notice: Subject to any disclaimer, the term of this patent is extended or adjusted under 35 U.S.C. 154(b) by 510 days.

(21) Appl. No.: 15/966,563

(22) Filed: Apr. 30, 2018

(65) Prior Publication Data
US 2019/0331757 A1    Oct. 31, 2019

(51) Int. Cl.
*G01S 11/16* (2006.01)
*G01S 3/801* (2006.01)
*G01N 29/34* (2006.01)
*G01N 29/44* (2006.01)
*G06T 17/00* (2006.01)
*G06F 30/20* (2020.01)

(52) U.S. Cl.
CPC .............. *G01S 3/801* (2013.01); *G01N 29/34* (2013.01); *G01N 29/4445* (2013.01); *G06F 30/20* (2020.01); *G06T 17/00* (2013.01)

(58) Field of Classification Search
None
See application file for complete search history.

(56) References Cited

U.S. PATENT DOCUMENTS

| 5,193,008 A * | 3/1993 | Frazier | G06K 15/1204 |
| | | | 347/254 |
| 5,218,427 A * | 6/1993 | Koch | A61F 2/30942 |
| | | | 356/602 |

(Continued)

OTHER PUBLICATIONS

Prieto, F., et al. "Range image accuracy improvement by acquisition planning." Proceedings of the 12th conference on vision interface (VI'99), Trois Rivieres, Québec, Canada. 1999. (Year: 1999).*

(Continued)

*Primary Examiner* — Hovhannes Badhdasaryan
*Assistant Examiner* — Jonathan D Armstrong
(74) *Attorney, Agent, or Firm* — Walters & Wasylyna LLC

(57) ABSTRACT

A method for testing a structure includes steps of: identifying a three-dimensional position of a surface of the structure relative to a reference frame; transmitting laser light from an output of a transmitter onto the surface of the structure to form ultrasonic waves in the structure and to detect a response to the ultrasonic waves; based on the three-dimensional position of the surface, moving the laser light over the structure along a scan path so that the output of the transmitter is located at a constant offset distance from the surface and that the laser light, transmitted from the output of the transmitter, is directed onto the surface at a constant angle of projection; and based on the response to the ultrasonic waves, determining whether an inconsistency is present in the structure.

20 Claims, 15 Drawing Sheets

(56) References Cited

U.S. PATENT DOCUMENTS

| | | | |
|---|---|---|---|
| 5,377,011 A * | 12/1994 | Koch | A61F 2/30942 356/602 |
| 5,458,527 A * | 10/1995 | Kondo | B24B 47/22 451/21 |
| 5,576,948 A | 11/1996 | Stern et al. | |
| 5,679,899 A * | 10/1997 | Webster | G01H 9/002 356/35.5 |
| 5,726,366 A * | 3/1998 | Washio | B23Q 17/20 356/635 |
| 5,995,650 A * | 11/1999 | Migdal | H04N 13/254 382/154 |
| 6,405,069 B1 * | 6/2002 | Oraevsky | A61B 5/0095 367/7 |
| 6,741,363 B1 * | 5/2004 | Kaupert | G01B 11/25 250/559.23 |
| 6,981,417 B1 * | 1/2006 | Oravecz | G01N 29/0609 73/612 |
| 7,000,475 B2 * | 2/2006 | Oravecz | G01N 29/0609 73/602 |
| 7,605,347 B2 | 10/2009 | Izawa et al. | |
| 7,751,057 B2 * | 7/2010 | Oldenburg | A61B 5/0073 356/497 |
| 7,957,583 B2 | 6/2011 | Boca et al. | |
| 8,042,765 B1 * | 10/2011 | Nance | B64D 45/0005 244/100 R |
| 8,095,237 B2 | 1/2012 | Habibi et al. | |
| 8,332,165 B1 | 12/2012 | Tat et al. | |
| 8,881,360 B2 * | 11/2014 | Townsend | G05B 19/05 29/402.01 |
| 9,164,066 B1 * | 10/2015 | Bossi | G01N 29/225 |
| 9,250,213 B1 * | 2/2016 | Bossi | G01N 29/2418 |
| 9,404,898 B1 | 8/2016 | Georgeson et al. | |
| 9,506,740 B2 * | 11/2016 | Brezinski | A61B 5/0066 |
| 9,575,033 B1 | 2/2017 | Georgeson et al. | |
| 9,590,603 B1 * | 3/2017 | Allouche | G01S 13/0209 |
| 9,625,423 B2 | 4/2017 | Bossi et al. | |
| 9,823,127 B2 * | 11/2017 | Wax | G01J 3/2823 |
| 10,309,893 B2 * | 6/2019 | Georgeson | G01N 29/0645 |
| 10,571,390 B2 * | 2/2020 | Motzer | G01N 29/2418 |
| 2005/0167569 A1 * | 8/2005 | Akano | G01S 3/781 250/206.1 |
| 2006/0235621 A1 * | 10/2006 | Cole | G01N 21/4795 702/19 |
| 2007/0157730 A1 * | 7/2007 | Ochiai | G01B 17/02 73/627 |
| 2008/0094643 A1 * | 4/2008 | Nishio | G01B 11/026 356/623 |
| 2009/0122942 A1 * | 5/2009 | Nakamura | G21C 17/003 376/249 |
| 2009/0301202 A1 * | 12/2009 | Bisiaux | G01N 29/0609 73/622 |
| 2011/0063121 A1 * | 3/2011 | Le Devehat | G08B 21/182 340/669 |
| 2013/0088724 A1 * | 4/2013 | Dubois | G01H 9/00 356/519 |
| 2014/0116146 A1 * | 5/2014 | Bossi | G01N 29/265 73/643 |
| 2014/0216158 A1 * | 8/2014 | Sanabria Martin | G01N 29/06 73/588 |
| 2014/0257079 A1 * | 9/2014 | Irisawa | A61B 8/4416 600/407 |
| 2016/0303736 A1 | 10/2016 | Setsuda | |
| 2017/0010242 A1 | 1/2017 | Safai | |
| 2017/0176321 A1 | 6/2017 | Georgeson et al. | |
| 2017/0176322 A1 * | 6/2017 | Motzer | G01N 29/2418 |
| 2017/0176393 A1 * | 6/2017 | O'Donnell | G01N 21/1702 |
| 2017/0248551 A1 | 8/2017 | Pelivanov | |
| 2018/0009059 A1 | 1/2018 | Aoki | |

OTHER PUBLICATIONS

Mahmud, Mussa, et al. "3D part inspection path planning of a laser scanner with control on the uncertainty." Computer-Aided Design 43.4 (2011): 345-355. (Year: 2011).*

Wu, Qian, et al. "Path planning for surface inspection on a robot-based scanning system." 2015 IEEE International Conference on Mechatronics and Automation (ICMA). IEEE, 2015. (Year: 2015).*

Vandenrijt, J-F., et al. "Nondestructive inspection of aerospace composites by a fiber-coupled laser ultrasonics system." Fifth International Conference on Optical and Photonics Engineering. vol. 10449. International Society for Optics and Photonics, 2017. (Year: 2017).*

Phan, Nguyen Duy Minh, et al. "Path planning of a laser-scanner with the control of overlap for 3d part inspection." Procedia Cirp 67 (2018): 392-397. (Year: 2018).*

* cited by examiner

SYSTEM AND METHOD FOR TESTING A STRUCTURE USING LASER ULTRASOUND

FIELD

The present disclosure is generally related to nondestructive inspection and, more particularly, to nondestructive inspection of a structure using laser ultrasound.

BACKGROUND

In manufacturing aircraft, vehicles, and other structures, inspection of parts used to form these structures is often performed to determine whether the parts have appropriate parameters and properties for desired functions and performance. Additionally, the structures and/or parts may be inspected as part of normal maintenance. Nondestructive inspection is commonly used to evaluate the properties of a part without altering the ability of the part to be used for its desired function. Examples of nondestructive inspection include ultrasound testing, eddy current testing, x-ray testing, and visual inspections.

Ultrasound testing is often used to perform inspections on aircraft parts that are formed of composite materials. Ultrasound testing involves transmitting acoustic waves (i.e., sound waves) through a test object and detecting a response to the acoustic waves. The response is analyzed to determine whether inconsistencies are present in the test object.

Ultrasound testing is commonly performed using a transducer that is configured to send acoustic waves into the test object and detect the response to the acoustic waves. Typically, the transducer is coupled to a surface of the test object by placing the transducer in physical contact with the test object. In many cases, a coupling medium, such as water, oil, a water-based gel, or some other liquid, is used to reduce the acoustic impedance between the transducer and the test object. However, in many cases coupling the transducer to the surface of the test object may be difficult and complex. For example, when the test object has a non-constant geometry, a non-planar surface, or other non-planar features, it may be difficult and complex to couple the transducer to the test object in a manner that ensures that sound enters the test object in a desired direction, such as perpendicular to the surface. Further, in some cases, it may be difficult and complex to contain the coupling medium. Moreover, in some cases, use of the coupling medium may simply be undesirable with certain types of test objects.

Laser ultrasound testing is an example of non-destructive inspection that overcomes the difficulties and complexities of physically coupling a transducer to a test object by enabling inspection of the test object without requiring physical contact with the test object. Typically, laser ultrasound testing uses a laser beam to generate ultrasonic waves in the test object and another separate laser beam to detect a response to the ultrasonic waves to generate data about the test object. However, in many cases, inspecting the test object with a single channel laser (e.g., a single transmit laser and receive laser) is too slow for practical implementation. To address this issue, an array of lasers may be used. However, the size, weight, and cost of high-energy lasers typically used for laser ultrasound testing may make use of an array of lasers impractical. To address this issue, an array of low-energy lasers may be used. However, use of low-energy lasers requires proper alignment and standoff distances to be maintained throughout a scanning process of the array of lasers in order for usable data to be generated, particularly, when the test object has a non-constant geometry. In many cases, maintaining proper alignment and standoff is difficult and may require complex mechanical control systems to maintain laser-to-part alignment, which may significantly slow the scanning rate of the laser ultrasound testing system.

Accordingly, those skilled in the art continue with research and development efforts in the field of laser ultrasound testing.

SUMMARY

In an example, the disclosed method for testing a structure using laser ultrasound includes steps of: (1) identifying a three-dimensional position of a surface of the structure relative to a reference frame; (2) transmitting laser light from an output of a transmitter onto the surface of the structure to form ultrasonic waves in the structure and to detect a response to the ultrasonic waves; (3) based on the three-dimensional position of the surface, moving the laser light over the structure along a scan path so that the output of the transmitter is located at a constant offset distance from the surface and that the laser light, transmitted from the output of the transmitter, is directed onto the surface at a constant angle of projection; and (4) based on the response to the ultrasonic waves, determining whether an inconsistency is present in the structure.

In an example, the disclosed laser ultrasound testing system includes a laser source configured to emit laser light and a transmitter optically coupled with the laser source and configured to transmit the laser light from an output of the transmitter onto a surface of a structure. The laser light is configured to form ultrasonic waves in the structure and to detect a response to the ultrasonic waves. The laser ultrasound testing system also includes a movement mechanism coupled to the transmitter and configured to move the transmitter relative to the structure. The laser ultrasound testing system also includes a computer. The computer is configured to identify a three-dimensional position of the surface relative to a reference frame. The computer is further configured to control the movement mechanism so that the laser light moves over the structure along a scan path in which the output of the transmitter is located at a constant distance from the surface and the laser light, transmitted from the output of the transmitter, is directed at a constant angle of projection onto the surface based on the three-dimensional position of the surface. The computer is further configured to determine whether an inconsistency is present in the structure based on the response to the ultrasonic waves.

Other examples of the disclosed system and method will become apparent from the following detailed description, the accompanying drawings and the appended claims.

DETAILED DESCRIPTION

Figure 1:
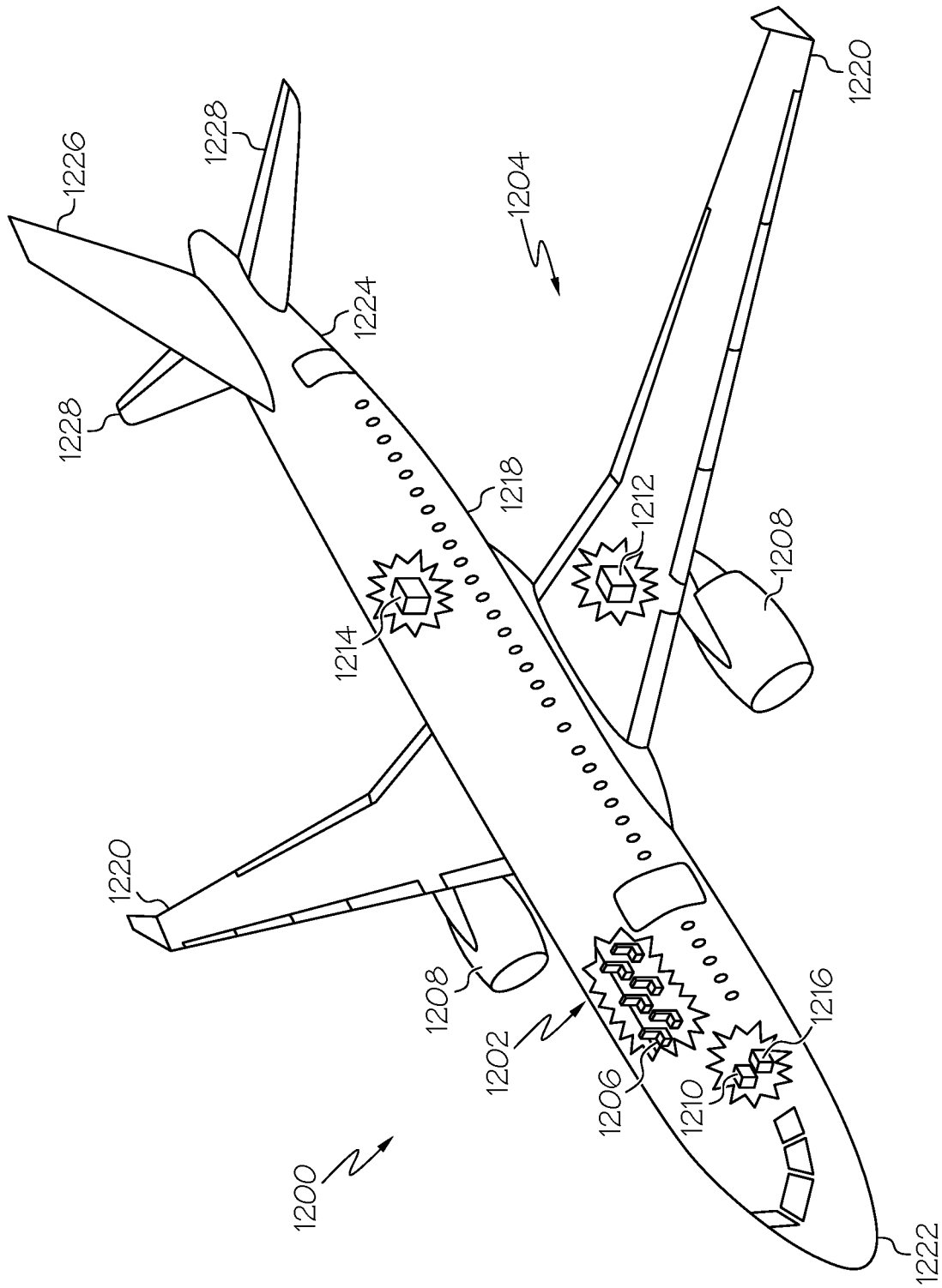
FIG. 1 is a schematic, perspective view of an example of an aircraft.

The following detailed description refers to the accompanying drawings, which illustrate specific embodiments and/or examples described by the disclosure. Other embodiments and/or examples having different structures and operations do not depart from the scope of the present disclosure. Like reference numerals may refer to the same feature, element or component in the different drawings.

Illustrative, non-exhaustive examples, which may be, but are not necessarily, claimed, of the subject matter according the present disclosure are provided below.

FIG. 1 is an illustrative example of an aircraft 1200. In the illustrative example, the aircraft 1200 is a fixed-wing aircraft. The aircraft 1200 includes an airframe 1202 and a plurality of high-level systems 1204 and an interior 1206. Examples of the high-level systems 1204 include one or more of a propulsion system 1208, an electrical system 1210, a hydraulic system 1212, an environmental system 1214 and a communications system 1216. In other examples, the aircraft 1200 may include any number of other types of systems.

In an example, the aircraft 1200 includes an airframe 1202. The airframe 1202 forms a fuselage 1218. The fuselage 1218 defines an interior 1206 of the aircraft 1200, which may include a passenger compartment and/or a cargo compartment. The fuselage 1218 is the main body of the aircraft 1200 and includes any suitable central structure configured to hold a crew, one or more passengers, and/or cargo. In the illustrative example, the fuselage 1218 is an elongate, generally cylindrical fuselage.

The fuselage 1218 includes a nose section 1222 at a forward end of the aircraft 1200 and a tail section 1224 at an aft end of the aircraft 1200. As used herein, the terms "forward" and "aft" have their ordinary meaning as known to those skilled in the art and refer to positions relative to a direction of movement of the aircraft 1200. The tail section 1224 also includes a vertical stabilizer 1226 and at least one horizontal stabilizer 1228.

The aircraft 1200 also includes a pair of wings 1220 (also referred to individually as wing 1220). Each one of the wings 1220 is coupled to the fuselage 1218. The wings 1220 include any suitable airfoil structures that are configured to provide lift to the aircraft 1200. In the illustrative example, the wings 1220 are elongate structures extending from a lower portion of the fuselage 1218 in a swept wing, tapered planform. In other examples, the wings 1220 are straight or delta-shaped. In still other examples, the wings 1220 are trapezoidal, constant, elliptical, semi-elliptical, or other configurations known in the art.

In the illustrative example, the propulsion system 1208 includes turbofan engines that are mounted to the wings 1220, for example, by pylons. In an example, each engine is housed in a nacelle, which includes an inlet and a nozzle. In other examples, the engines may be mounted to the fuselage 1218 or other aircraft structures, such as the tail section 1224. In various other examples, the propulsion system 1208 may include more or fewer engines and other types of engines (e.g., turboprop engines) may be used.

The aircraft 1200 may also include various flight control surfaces. The flight control surfaces include any aerodynamic device that is used to adjust and control flight and aerodynamic characteristics of the aircraft 1200. Examples of the flight control surfaces include flaps that are located on the trailing end of the wings 1220, elevators that are located on the trailing end of the horizontal stabilizers 1228, a rudder that is located on the trailing end of the vertical stabilizer 1226, and other control surfaces, such as leading end flaps, ailerons, and spoilers.

In an example, the aircraft 1200 includes various structural members that form the airframe 1202, the fuselage 1218, the wings 1220, the vertical stabilizer 1226, the horizontal stabilizer 1228, and other structures of the aircraft 1200. Examples of the structural members include skin panels, stringers, spars, ribs, and other types of parts. These structural members are coupled together by any one of various methods including, but not limited to, connection by various kinds of fasteners, co-curing, structurally bonding (e.g., adhesively bonding), or integrally forming.

The aircraft 1200 is an example of an aircraft having composite structures that may be inspected with a laser ultrasound testing system. For example, composite skin panels, composite stringers, and other composite structures may be inspected using a laser ultrasound testing system.

Figure 2:
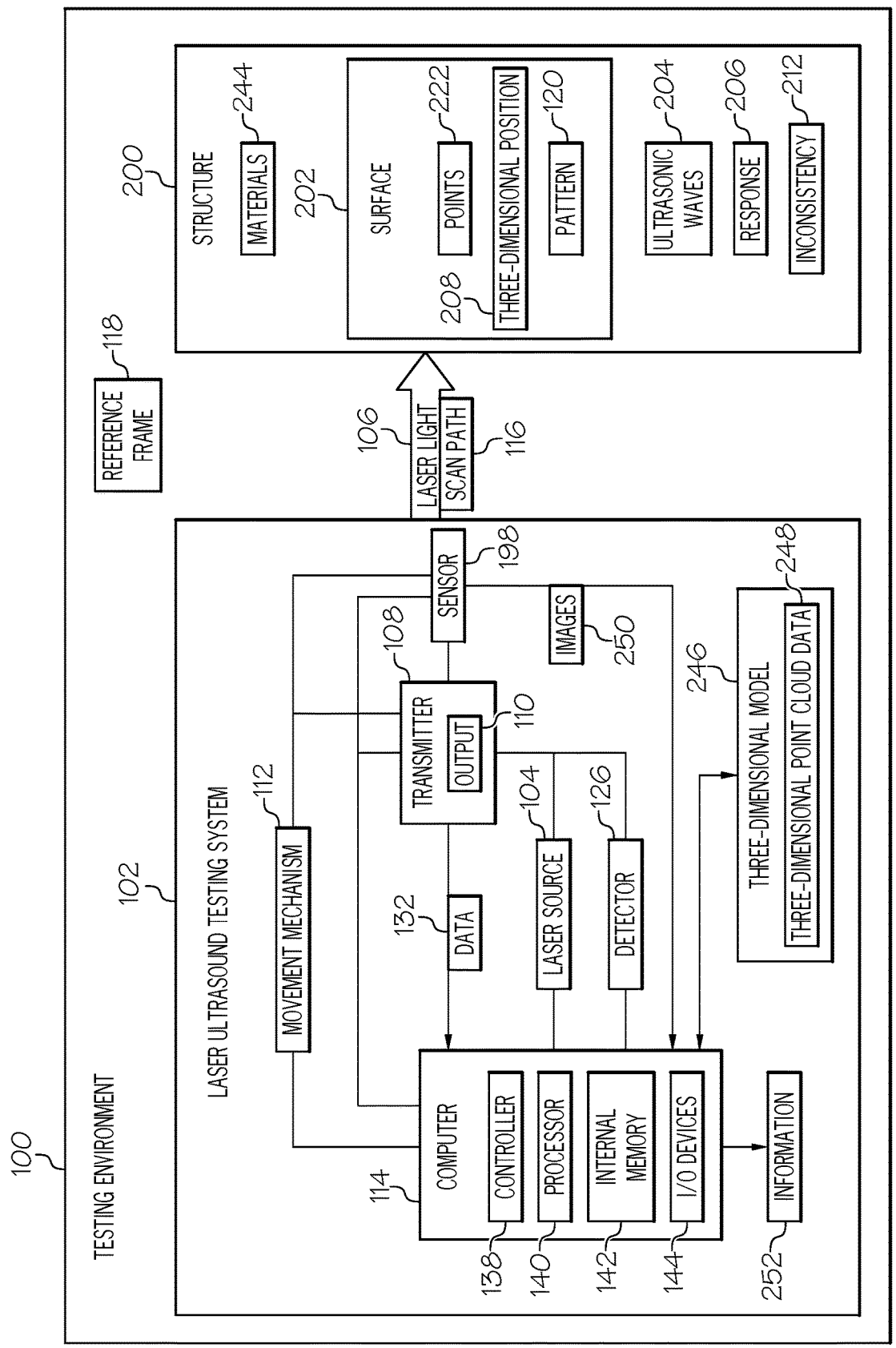
FIG. 2 is a schematic block diagram of an example of a testing environment.

FIG. 2 depicts an example of a testing environment 100. The testing environment 100 is an example of an environment in which a laser ultrasound testing system 102 is used to test a structure 200. In various examples, the structure 200 includes any article or object that is to be tested using the laser ultrasound testing system 102.

As used herein, the terms "test," "testing," and similar terms, such as in reference to testing the structure 200, refer to nondestructive testing (NDT), nondestructive examination (NDE), nondestructive inspection (NDI), nondestructive evaluation (NDE), and other analysis techniques used to inspect and/or evaluate properties of a structure, material, or component without permanently altering or causing damage to the article being tested.

In an example, the laser ultrasound testing system 102 includes a laser source 104. The laser source 104 is configured to emit laser light 106. The laser ultrasound testing system 102 also includes a transmitter-receiver, generally referred to herein as transmitter 108. The transmitter 108 is optically coupled with the laser source 104. The transmitter 108 is configured to transmit the laser light 106 from an output 110 of the transmitter 108 onto a surface 202 of the structure 200. During the ultrasound testing operation, the laser light 106 takes the form of transmit laser light and receive laser light. The laser light 106 (e.g., the transmit laser light) is configured to form or otherwise generate ultrasonic waves 204 in the structure 200. The laser light 106 (e.g., the receive laser light) is configured to detect a response 206 to the ultrasonic waves 204.

The laser ultrasound testing system 102 also includes a movement mechanism 112. The movement mechanism 112 is coupled to the transmitter 108. The movement mechanism 112 is configured to move the transmitter 108 relative to the structure 200.

The laser ultrasound testing system 102 also includes a computer 114. The computer 114 is configured to identify a three-dimensional position 208 of the surface 202 relative to a reference frame 118. Based on the three-dimensional position 208 of the surface 202, the computer 114 is also configured to control the movement mechanism 112 so that the laser light 106 moves over the structure 200 along a scan path 116 in which the output 110 of the transmitter 108 is located at a constant distance from the surface 202 and the laser light 106, transmitted from the output 110 of the transmitter 108, is directed at a constant angle of projection onto the surface 202. The computer 114 is also configured to determine whether an inconsistency 212 is present in the structure 200 based on the response 206 to the ultrasonic waves 204.

As used herein, the term "surface," such as in reference to the surface 202 of the structure 200, has its ordinary meaning as known to those skilled in the art and includes any portion of an outer face of the structure 200 onto which the laser light 106 is transmitted during an ultrasound testing operation.

As used herein, the reference frame 118 is a reference coordinate system that is defined with respect to the testing environment 100. In an example, the reference frame 118 is a three-dimensional Cartesian coordinate system that is defined by an X-axis, a Y-axis, and a Z-axis. In another example, the reference frame 118 may employ other reference systems, such as a polar coordinate system.

As used herein, a three-dimensional position, such as in reference to the three-dimensional position 208 of the surface 202 of the structure 200, is represented by a three-dimensional coordinate of a point that is located in a reference coordinate system, such as that of a reference frame. In an example, the three-dimensional position 208 takes the form of a XYZ-coordinate of a point on the surface 202 in the reference frame 118.

As used herein, inconsistency 212 includes, but is not limited to, an undesired level or porosity, delamination, and other undesired features or propertied in the structure 200.

The structure 200 may include, or is formed from, number of materials 244. As used herein, "number of" items means one or more items. In this manner, the number of materials 244 includes one or more materials.

In an example, the structure 200 is a composite structure and number of materials 244 is number composite materials. In other words, the composite structure includes, or is formed from, the number composite materials. Generally, composite structures are tough and lightweight and are created by combining two or more functional composite materials. In other examples, the number of materials 244 may also include a metallic material, a plastic material, or other suitable types of materials.

In an example, the number of composite materials includes a matrix material and a reinforcement material. In an example, the matrix material takes the form of a thermoset resin (e.g., epoxy), a thermoplastic polymer (polyester, vinyl ester, nylon, etc.), or other types of matrix material. In an example, the reinforcement material takes the form of fibers (e.g., glass fibers, carbon fibers, aramid fibers, etc.) or other types of reinforcement materials. The fibers may be unidirectional or may take the form of a woven or nonwoven cloth or fabric.

In an example, the structure 200 is a laminate structure. The laminate structure includes, or is formed from, a plurality of layers. In an example, one or more of the plurality of layers includes, or is formed from, the number of composite materials.

The structure 200 may take any number of forms. In an example, the structure 200 is a part of (e.g., a structural member of) the aircraft 1200 (FIG. 1) or is a portion of a structure of the aircraft 1200. In an example, the structure 200 is a composite part of the aircraft 1200, such as the fuselage 1218, the wing 1220, the vertical stabilizer 1226, the horizontal stabilizer 1228, or another structure of the aircraft 1200. In an example, the structure 200 is one or more composite structural members that form at least one of the fuselage 1218, the wing 1220, the vertical stabilizer 1226, the horizontal stabilizer 1228, or another structure of the aircraft 1200, such as a skin panel, a stringer, a spar, a rib, a wing box, a stiffener, or other types of parts.

The present disclosure recognizes that composite structures are beneficially used in aircraft to decrease the weight of the aircraft, which improves performance features, such as payload capacity and fuel efficiency. Composite structures also provide longer service life for various components of the aircraft.

In manufacturing composite structures, layers of composite material are typically laid up on a tool. The layers may include fibers in the form of sheets. The sheets may take the form of fabrics, tape, tows, or other suitable forms. In some cases, resin may be infused or preimpregnated into the sheets. These types of sheets are commonly referred to as prepreg. The different layers of prepreg may be laid up in different orientations and different numbers of layers may be used depending on the performance requirements of the composite structure being manufactured.

The present disclosure also recognizes that inconsistencies may be introduced to the composite structure during manufacturing or during use of the composite structure. Due to the spacing of the layers that make up the composite structure, inspection of the composite structure may be more difficult than desired for some locations or some types of inconsistencies. Additionally, some inconsistencies may not be detectable using conventional non-destructive inspecting techniques.

Further, the present disclosure recognizes that inspecting composite structures that have a non-constant geometry may be more difficult than desired. Generally, in order to generate accurate and usable information from laser ultrasound testing, a position of the transmitter of the laser beam relative to the object being tested must be controlled so that the distance travelled by the laser beam (e.g., the offset distance between the output of the transmitter and the surface of the object) and the angle of impingement of the laser beam with the surface remains constant throughout the scanning process. This position control is particularly important when using a low energy laser for the laser ultrasound testing. Such position control is not unduly difficult when there is little or no variation in the geometry of the surface along one or more primary axes of the object. However, when the geometry of the surface of the object varies along all the primary axes of the object, maintaining proper alignment and standoff may be more difficult than desired and may require complex mechanical controls, complex laser controls, or manual presetting at each location to maintain the orientation of the laser relative to the surface.

Figure 3:
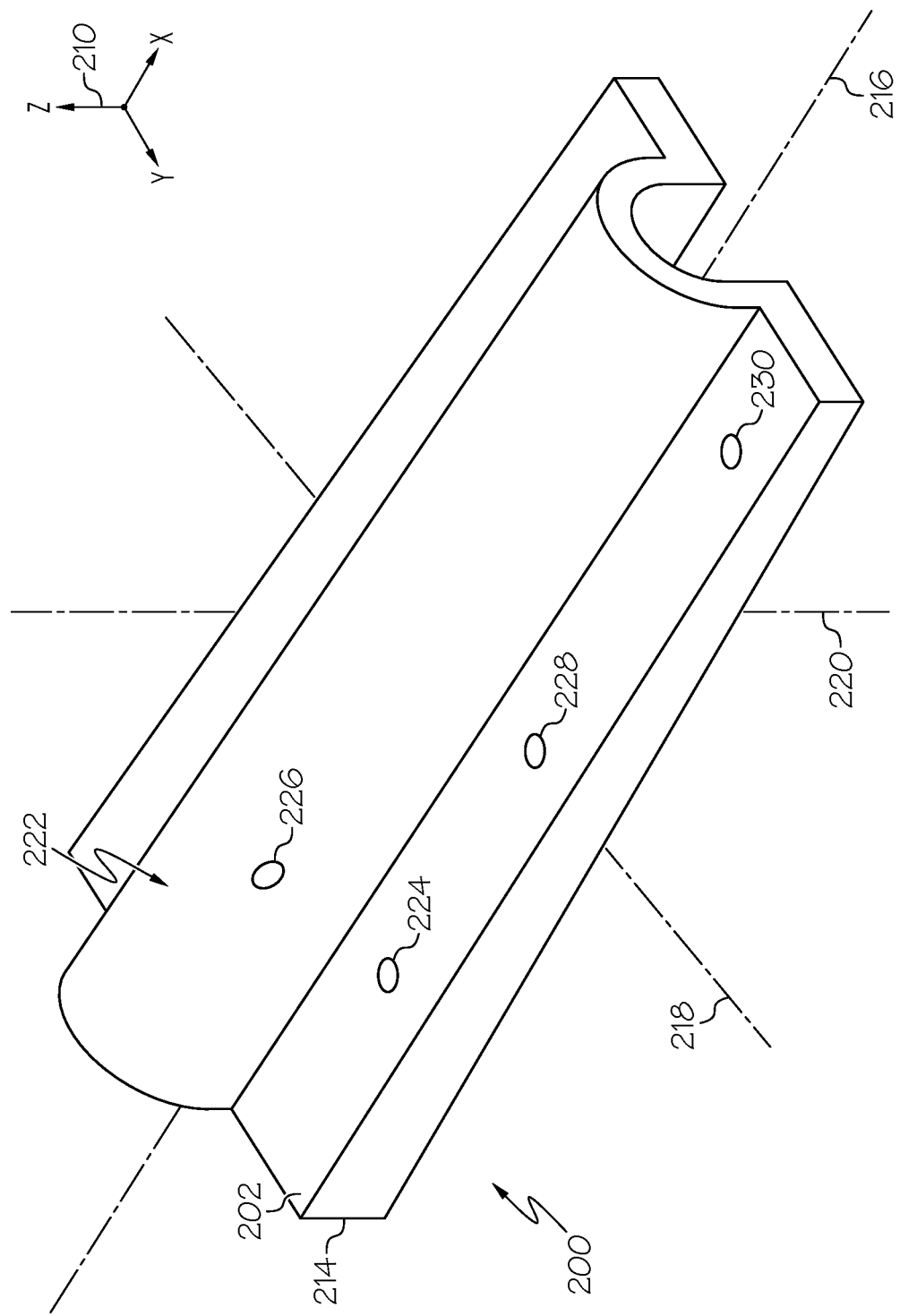
FIG. 3 is a schematic, perspective view of an example of a structure to be tested using laser ultrasound.

FIG. 3 is an illustrative example of the structure 200. In the illustrative example, the structure 200 is a stiffener 214 of the aircraft 1200 (FIG. 1), such as a stringer or a spar of the wing 1220, the vertical stabilizer 1226, or the horizontal stabilizer 1228. Any portion of the surface 202 of the structure 200 or any one of the plurality of points 222 (FIG. 2) on the surface 202 of the structure 200 has a corresponding three-dimensional position 208 relative to a structure reference frame 210.

As used herein, the structure reference frame 210 is a reference coordinate system that is defined with respect to a point on and that is rigid to the structure 200. In an example, the structure reference frame 210 is a three-dimensional Cartesian coordinate system that is defined by an X-axis, a Y-axis, and a Z-axis and that is, for example, aligned with the primary axes of the structure 200.

In an example, the structure reference frame 210 forms the reference frame 118 of the testing environment 100. In an example, the structure reference frame 210 is transformed for alignment with the reference frame 118 of the testing environment. As used herein, the term "transform," "transformed," "transformation," and similar terms, such as in reference to transformation of a reference frame, refer to a three-dimensional rotation and/or translation in which one reference frame is substantially aligned with another reference frame or the orthogonal axes of one coordinate system are substantially aligned with the orthogonal axes of another coordinate system.

In an example, the structure 200 has a non-constant geometry along each of its primary axes. As used herein, the term "primary axes" refers to the orthogonal axes of an item. In an example, the primary axes of the structure 200 include a first axis 216, a second axis 218 that is perpendicular to the first axis 216, and a third axis 220 that is perpendicular to the first axis 216 and the second axis 218. In the illustrative example, the first axis 216 is formed along the length dimension of the structure 200 (e.g., a longitudinal axis), the second axis 218 is formed along the width dimension of the structure 200 (e.g., a lateral axis), and the third axis 220 is formed along the thickness, or depth, dimension of the structure 200. Therefore, in the illustrative example, a profile contour or a change in profile shape of the surface 202 is represented by changes in the surface 202 along the third axis 220.

In an example, due to the non-constant geometry of the structure 200, the three-dimensional position 208 of the surface 202 relative to the structure reference frame 210 changes along each one of the primary axes of the structure 200 or in each one of the primary dimensions (e.g., length, width, and thickness) of the structure 200. In other words, the profile shape of the surface 202 varies when viewed in a YZ-plane of the structure reference frame 210 (a virtual plane defined by the Y-axis and the Z-axis of the structure reference frame 210) and/or when viewed in an XZ-plane of the structure reference frame 210 (a virtual plane defined by the X-axis and the Z-axis of the structure reference frame 210).

In an example, the profile shape of the surface 202 relative to the structure reference frame 210 is defined by the three-dimensional position 208 of each one of the plurality of points 222 on the surface 202. Each one of the points 222 on the surface 202 has a corresponding three-dimensional position 208 that is different than any other one of the points 222 on the surface 202. In an example, the three-dimensional position 208 of each one of the points 222 is a XYZ-coordinate relative to the structure reference frame 210 and, thus, also has a XYZ-coordinate relative to the reference frame 118 of the testing environment 100.

In the illustrative example, a first point 224 on the surface 202 has a corresponding first three-dimensional position 208, a second point 226 on the surface 202 has a corresponding second three-dimensional position 208, a third point 228 on the surface 202 has a corresponding third three-dimensional position 208, a fourth point 230 on the surface 202 has a corresponding fourth three-dimensional position 208, etc. The corresponding three-dimensional position 208 of each one of the first point 224, the second point 226, the third point 228, and the fourth point 230 is different.

More specifically, in the illustrative example, the first point 224 and the second point 226 have the same X-coordinate (e.g., the same position along the X-axis of the structure reference frame 210). The first point 224 and the second point 226 have a different Y-coordinate (e.g., a different position along the Y-axis of the structure reference frame 210). The first point 224, the third point 228, and the fourth point 230 have the same Y-coordinate (e.g., the same position along the Y-axis of the structure reference frame 210). The first point 224, the third point 228, and the fourth point 230 have a different X-coordinate (e.g., a different position along the X-axis of the structure reference frame 210). The first point 224, the second point 226, the third point 228, and the fourth point 230 have a different Z-coordinate (e.g., a different position along the Z-axis of the structure reference frame 210).

Figure 4:
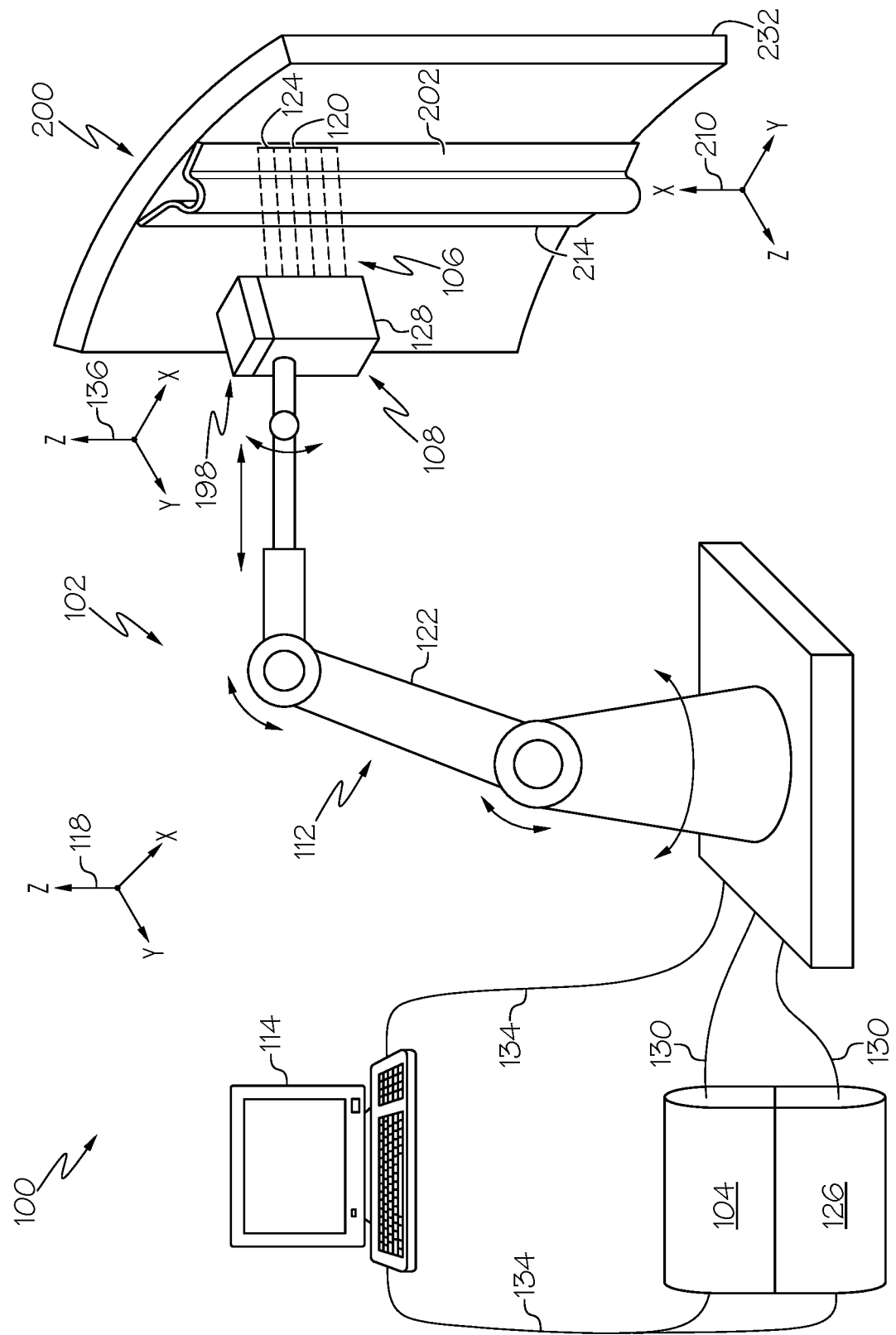
FIG. 4 is a schematic illustration of an example of the testing environment.

FIG. 4 illustrates an example of the testing environment 100 in which the disclosed laser ultrasound testing system 102 is used to test the structure 200. In the illustrative example, the structure 200 is a part of an aircraft and includes a skin panel 232, such as a composite skin panel, and the stiffener 214, such as a composite stringer. In an example, the stiffener 214 is permanently coupled with the skin panel 232. As examples, the stiffener 214 may be connected to the skin panel 232 by various kinds of fasteners (not shown), the stiffener 214 may be co-cured with the skin panel 232, the stiffener 214 may be structurally bonded (e.g., adhesively bonded) to the skin panel 232, or a combination thereof. While the illustrative example of the structure 200 includes only one stiffener 214 coupled to the skin panel 232, in other examples, additional stiffeners 214 (e.g., additional stringers) or other types of stiffeners 214 (e.g., spars) may be coupled to the skin panel 232.

The movement mechanism 112 is configured to move or otherwise manipulate the transmitter 108 relative to the structure 200 so that the laser light 106, emitted from the output 110 of the transmitter 108, is directed along the scan path 116 along the surface 202 of the structure 200 (e.g., scans or moves over or across the surface 202 of the structure 200). In various examples, the movement mechanism 112 may be implemented using a number of different types of systems.

In an example, the movement mechanism 112 includes, or takes the form of, a robot 122. The robot 122 may be, for example, a scanning robotic arm that is configured to move the transmitter 108 about a number of axes relative to the structure 200. In an example, the robot 122 includes a base, one or more arms, and one or more actuators (e.g., servomotors) that are operable to move the various arms. It is noted that the robot 122 may be include a greater or less number of arms and/or different types of members such that any desirable range of rotational and/or translational movement of the transmitter 108 may be provided. In other examples, the movement mechanism 112 may include a gantry robot or other suitable types of movement systems.

In an example, the transmitter 108 takes the form of, or is incorporated into, an end effector 128. The end effector 128 is removably coupled to the robot 122. The robot 122 is configured to move the end effector 128 relative to the structure 200.

The laser source 104 is configured to emit the laser light 106. In an example, during a first portion of the laser ultrasound testing operation, the laser light 106 has an energy that is configured to cause the ultrasonic waves to travel through the structure 200. As used herein, ultrasonic waves 204 are acoustic waves, or sound waves, formed in the structure 200 due to the laser light 106. During a second portion of the testing operation, the laser light 106 has an energy that is configured not to cause acoustic waves in the structure 200 and that is configured to detect a response to the laser light 106. This response includes information that is used to identify a response to the ultrasonic waves 204 in the structure 200.

In an example, the laser ultrasound testing system 102 also includes a detector 126. The detector 126 is configured to detect laser energy and generate data 132 (FIG. 2). In an example, the detector 126 includes a number of detectors. In an example, the detector 126 includes a number of photodetectors. In an example, when the laser light 106 encounters the ultrasonic waves 204 in the structure 200, a return path of the laser light 106 may be altered. The detector 126 is configured to detect this alteration.

In an example, the data 132 is used to identify information 252 about the structure 200. This information 252 includes, but is not limited to, a thickness of the structure 200, a material composition (e.g., materials 244) of the structure 200, an indication of whether any undesired inconsistencies 212 are present on and/or in the structure 200, and/or other types of information.

In some examples, the data 132 generated by the detector 126 includes a plurality of data points. Generally, increasing the number of data points included in the data 132 enables a higher signal-to-noise ratio to be achieved using currently available signal processing techniques. In an example, the number of data points in the data 132 may be increased by increasing the rate at which the laser light 106 scans the structure 200, by scanning the same area of the surface 202 multiple times, by arranging the laser light 106 into a pattern, or an array of spots, on the surface 202, or a combination thereof.

In an example, the laser source 104 and the detector 126 are separate components of the laser ultrasound testing system 102. In an example, the laser source 104 and the detector 126 are combined into a single component of the laser ultrasound testing system 102. In an example, one or both of the laser source 104 and the detector 126 form a portion of the transmitter 108 and/or are incorporated into the end effector 128. In an example, one or both of the laser source 104 and the detector 126 are independent of the transmitter 108 and/or are separate from the end effector 128.

In an example, the laser source 104 and the detector 126 are optically coupled with the transmitter 108 over an optical communications link 130, as illustrated in FIG. 4. In an example, the optical communications link 130 includes a number of optical fibers.

The computer 114 is configured to control operation of the laser ultrasound testing system 102. The computer 114 is also configured to analyze the data 132 that is generated by the laser ultrasound testing system 102. In an example, the computer 114 may be one or more computers. When more than one computer is present, the computers may be in communications with each other through a communications medium, such as a network.

In an example, the computer 114 includes a controller 138 (FIG. 2) (e.g., a controller that is implemented within a computer). The controller 138 is configured to control operation of the movement mechanism 112 (e.g., the robot 122), the laser source 104, the detector 126, and other components of the laser ultrasound testing system 102. In various examples, the controller 138 is implemented using hardware, software, or a combination of hardware and software. When software is employed, operations to be performed may be implemented in the form of program code or instructions stored on a computer readable storage medium (e.g., a non-transitory computer readable storage medium) configured to be executed by a processor. When hardware is employed, the hardware may include circuits that operate to perform the operations.

In various examples, the hardware may take the form of a circuit system, an integrated circuit, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array (FPGA), and other suitable hardware devices.

In an example, the computer 114 is communicatively coupled with the movement mechanism 112, the laser source 104, the detector 126 over a data communications link 134. In an example, the data communications link 134 includes a number of wired connections, a number of wireless connections, or a combination thereof. The computer 114 is configured to provide operating instructions to the movement mechanism 112, the laser source 104, the detector 126 over the data communications link 134 over the data communications link 134. The computer 114 is also configured to receive the data 132 (FIG. 2) from the detector 126 over the data communications link 134.

In an example, the computer 114 also includes a processor 140 (FIG. 2). In an example, the processor 140 is configured to execute program code or instructions stored on internal memory 142, external memory (not shown), or a combination thereof. The processor 140 may take the form of any logic-processing unit, such as one or more of a central processing unit (CPU), a microprocessor, a digital signal processor (DSP), other suitable logic processors, or a combination thereof. The internal memory 142 may take the form of any data storage unit, such as one or more of read-only memory (ROM), random access memory (RAM), solid-state memory, a volatile or non-volatile storage device, other suitable data storage, or a combination thereof. The processor 140 is configured to analyze the data 132 that is generated by detector 126 from the response detected by the transmitter 108. This analysis may include an indication of whether number of inconsistencies 212 is present in the structure 200.

Further, the computer 114 also includes number of input/output (I/O) devices 144 (FIG. 2). Examples of the I/O devices 144 include, but are not limited to, one or more of a keypad, a keyboard, a touch-sensitive display screen, a liquid crystal display (LCD) screen, a microphone, a speaker, a communication port, or any combination thereof. The computer 114 is configured to generate information that is indicative whether number of inconsistencies 212 is present in the structure 200. This information may take number of different forms, such as an alert, a report, an image, other suitable information based on the ultrasound testing of the structure 200, or a combination thereof.

In an example, the alert may indicate whether the inconsistency 212 is present. The alert may be displayed on a display device coupled to the computer 114.

In an example, the image may be displayed on the display device of the computer 114. The image may be an image of a portion of or all of the structure 200 with a graphical indicator when the inconsistency 212 is present in the structure 200. The graphical indicator may be displayed in a location in the image corresponding to a location in the structure 200 where the inconsistency 212 is detected. In other examples, when the inconsistency 212 is absent, the graphical indicator may be displayed to indicate an absence of the inconsistency 212.

In an example, the report may identify any inconsistencies 212 in the structure 200. The report also may include other information, such as locations of inconsistencies, types of inconsistencies, sizes of inconsistencies, and other suitable types of information.

In an example, a pose of the movement mechanism 112 (e.g., the robot 122) and the pose of the transmitter 108 (e.g., the end effector 128) may be known to the computer 114 or may be ascertainable by the computer 114. As used herein, the term "pose," such as in reference to the pose of the transmitter 108, refers to a position and/or an orientation of an item relative to a reference frame. In an example, the movement mechanism 112 may include one or more sensors (e.g., encoders, Reed switches, position sensors, contact switches, accelerometers, etc.) or other devices positioned and configured to sense, measure, or otherwise determine information indicative of a current position, speed, acceleration, and/or orientation of the transmitter 108 relative to the reference frame 118.

In an example, the transmitter 108 includes a transmitter reference frame 136. As used herein, the transmitter reference frame 136 is a reference coordinate system that is defined with respect to a point on and that is rigid to the transmitter 108. In an example, the transmitter reference frame 136 is a three-dimensional Cartesian coordinate system that is defined by an X-axis, a Y-axis, and a Z-axis.

In an example, the computer 114 receives information from the various sensors or devices, and/or from actuators indicating the position and/or the orientation of the movement mechanism 112 relative to the reference frame 118. The computer 114 then computationally determines the pose of the transmitter 108 relative to the reference frame 118, for example, by performing a transformation of the transmitter reference frame 136 with respect to the reference frame 118.

Figure 5:
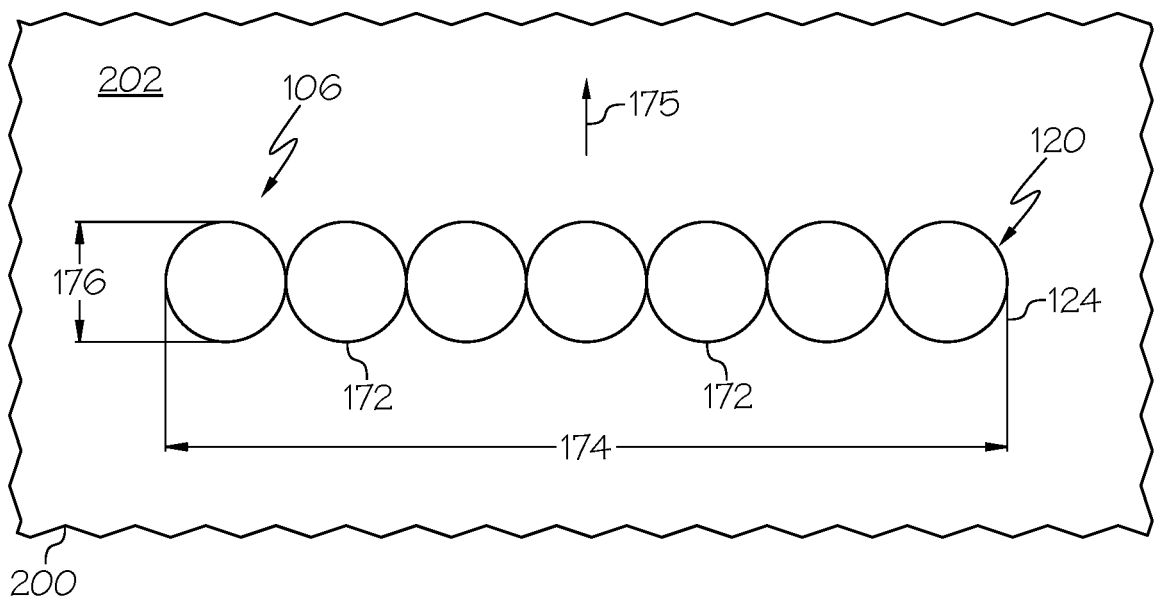
FIG. 5 is a schematic illustration of an example of a pattern of laser light transmitted onto a surface of the structure.

Referring to FIGS. 4 and 5, the transmitter 108 is configured to transmit the laser light 106 onto the surface 202 of the structure 200 in the form of a pattern 120. The pattern 120 of the laser light 106 is a plurality of areas on which the laser light 106 illuminates on the surface 202 of the structure 200. These areas may be circular, oval, square, oblique, or have some other shape depending on the angle of projection of the laser light 106 onto the surface 202. In an example, the laser light 106 takes the form of a plurality of laser beams and the pattern 120 of the laser light 106 is formed by the plurality of laser beams of the laser light 106, also referred to as an array of laser beams. In an example, the laser light 106 takes the form of a plurality of arrays of laser beams and the pattern 120 of the laser light 106 is formed by the plurality of arrays of laser beams of the laser light 106. In an example, each one of the plurality of arrays of laser beams are aligned with one another. In an example, at least one of the plurality of arrays of laser beams is offset or staggered relative to at least another one of the plurality of arrays of laser beams.

In the example illustrated in FIG. 5, the pattern 120 takes the form of a plurality of spots 172 arranged in a linear pattern formed by the laser light 106. In an example, each one of the plurality of spots 172 is formed by a corresponding one of the plurality of laser beams of the laser light 106.

In an example, a linear distance between centers of adjacent ones of the plurality of spots 172 is approximately 0.08 inch (80 mils or 2 millimeters). Such a spacing of the plurality of spots 172 enables data 132 to be collected that characterizes a point on the surface 202 every 0.08-inch. In an example, the number of data points in the data 132 may be increased by increasing the a density of the spots 172 formed by the plurality of laser beams of the laser light 106 (e.g., by reducing the linear distance between centers of adjacent ones of the plurality of spots 172 and/or increasing the number of spots 172 over a length of the pattern 120). In an example, the pattern 120 of the laser light 106 is sufficiently dense (e.g., has a sufficient number of spots 172 over a length of the pattern 120) to enable smaller features of the structure 200 to be characterized. In an example, increasing the density of the spots 172 formed by the plurality of laser beams of the laser light 106 may also reduce the number of times an area on the surface 202 needs to be scanned and, thus, increase the scan rate of the laser ultrasound testing system 102.

In an example, the pattern 120 is, or takes the form of, a line 124. The line 124 is defined by a linear arrangement of the spots 172 formed by the laser light 106. In an example, the pattern 120 is a straight line. In other words, the transmitter 108 is configured to transmit the pattern 120 of the laser light 106 in the form of a straight line onto the surface 202 of the structure 200. In an example, the line 124 is a continuous line. In another example, the line 124 is a non-continuous line.

In another example, the pattern 120 takes the form of a single spot 172 formed by the laser light 106.

Generally, ultrasound testing of the structure 200 using the linear pattern rather than a single point enables faster testing of the structure 200.

In other examples, the pattern 120 may have a shape resembling a rectangle or other suitable shape.

In an example, the pattern 120 has a first (e.g., major) linear dimension 174 and a second (e.g., minor) linear dimension 176. The first linear dimension 174 defines a length dimension of the pattern 120 formed by the plurality of spots 172. In an example, the number of spots 172 of the array of laser beams of the laser light 106 over first linear dimension 174 of the pattern 120 defines the density of the pattern 120. The second linear dimension 176 defines a width dimension of the pattern 120 formed by a spot size of the spots 172.

In an example, the first linear dimension 174 of the pattern 120 is less than or equal to approximately 6 inches (152 millimeters). In an example, the first linear dimension 174 of the pattern 120 is less than or equal to approximately 2 inches (50 millimeters). In an example, the first linear dimension 174 of the pattern 120 is less than or equal to approximately 1 inch (25 millimeters).

In an example, each spot 172 forming the pattern 120 has a spot size less than or equal to approximately 5 millimeters. Therefore, in an example, the second linear dimension 176 of the pattern 120 is less than or equal to approximately 5 millimeters. In an example, each spot 172 forming the pattern 120 has a spot size less than or equal to approximately 1 millimeter. Therefore, in an example, the second linear dimension 176 of the pattern 120 is less than or equal to approximately 1 millimeters.

Figure 6:
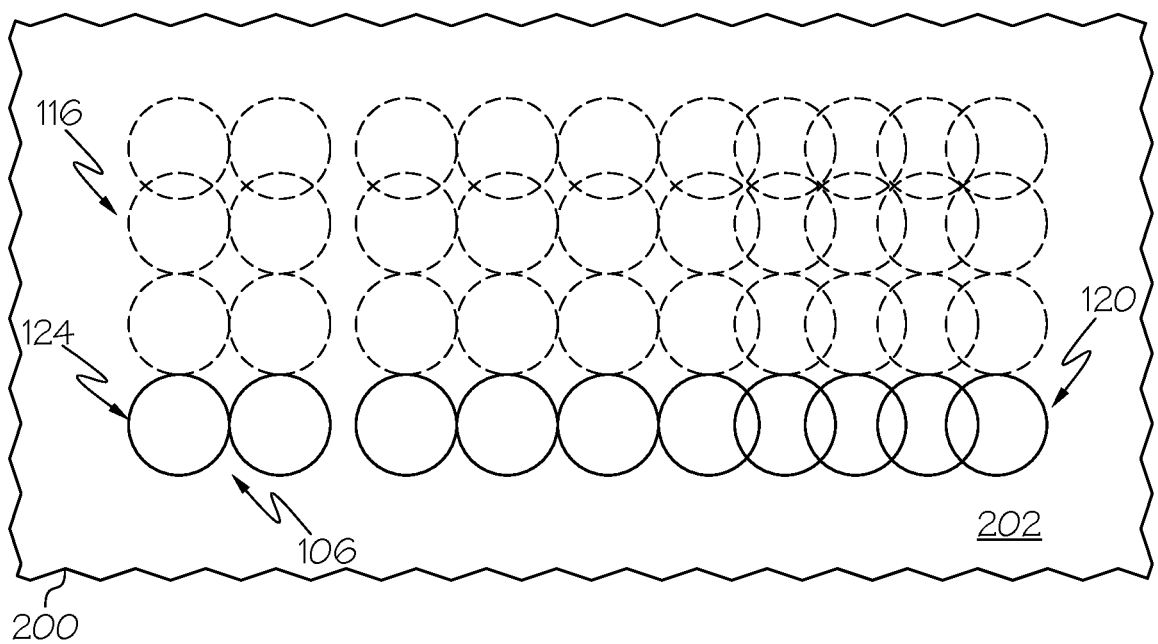
FIG. 6 is a schematic illustration of an example of the pattern of the laser light transmitted onto the surface of the structure.

Referring to FIG. 6, the movement mechanism 112 (FIG. 2) manipulates the transmitter 108 to move the pattern 120 of the laser light 106 across the surface 202 of the structure 200, for example, in the direction of arrow 175 (FIG. 5), along the scan path 116 to scan the structure 200. The locations of the pattern 120 (e.g., each spot 172) on the surface 202 of the structure 200, as the laser light 106 is moved along the scan path 116, are depicted with broken lines in FIG. 6.

In an example, one or more of the spots 172 forming the pattern 120 may touch or at least partially overlap one or more directly adjacent spots 172 so that the same area on the surface 202 is covered by more than one spot 172 of the pattern 120 of the laser light 106. In other words, the pattern 120 of the laser light 106 is a continuous line. In an example, one or more of the spots 172 may be spaced away from a directly adjacent spot 172 so that a portion of the surface 202 is not covered by a spot 172 of the pattern 120 of the laser light 106. In other words, the pattern 120 of the laser light 106 is a non-continuous line.

Figure 7:
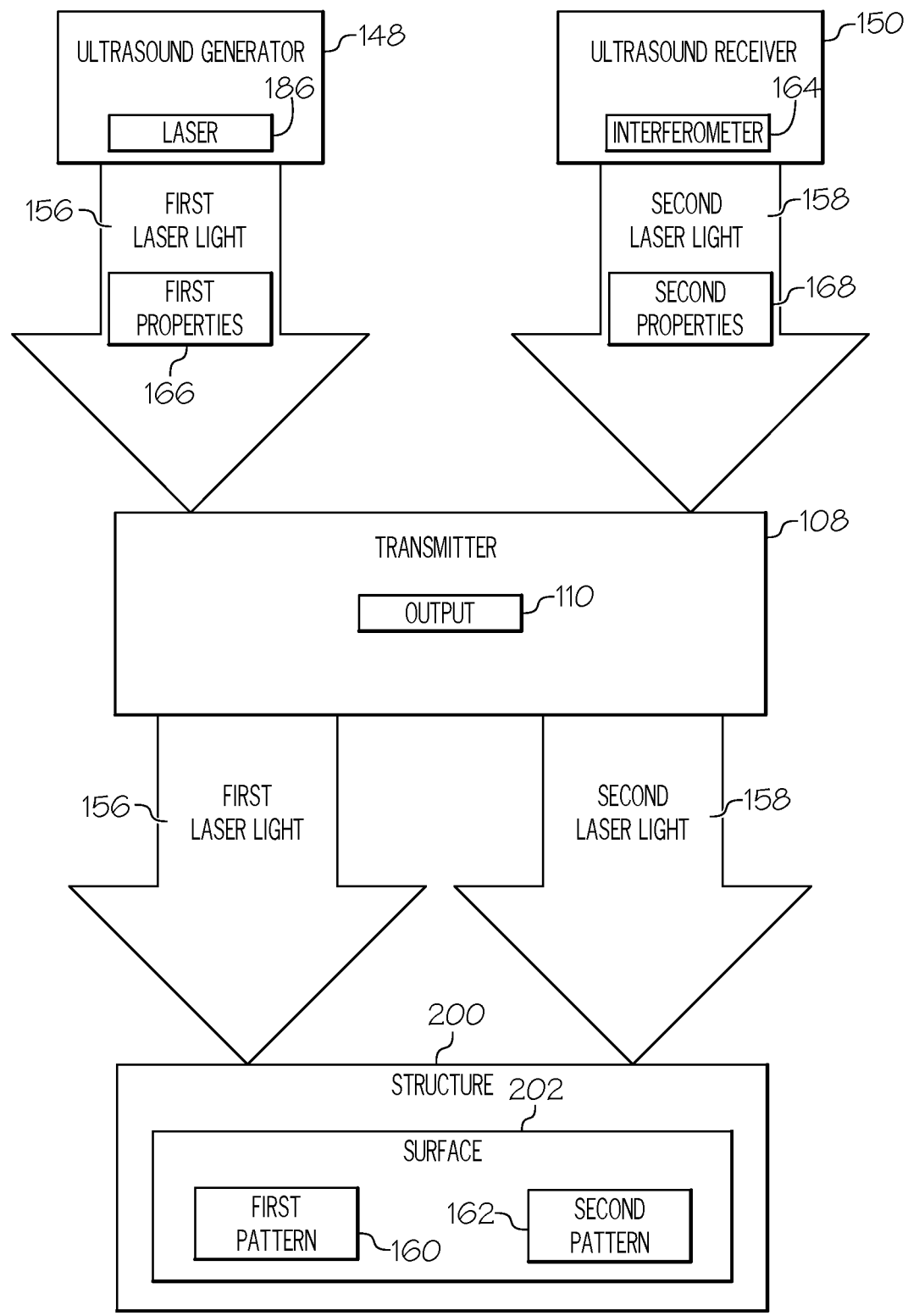
FIG. 7 is a schematic block diagram of a portion of an example of a laser ultrasound testing system.

Referring to FIG. 7, in an example, the laser ultrasound testing system 102 includes an ultrasound generator 148. The ultrasound generator 148 is configured to generate and emit first laser light 156. The ultrasound generator 148 is an example of laser source, such as the laser source 104 (FIG. 2). The first laser light 156 is an example of transmit, or ultrasound generation, laser light, such as the laser light 106 (FIG. 2). In an example, the ultrasound generator 148 includes, or takes the form of, a laser 186. In an example, the laser 186 is configured to emit the first laser light 156.

In an example, the first laser light 156 is coherent light. In an example, the ultrasound generator 148 is configured to generate the coherent light. In other words, the laser 186 is a coherent light source. In an example, the first laser light 156 is, or takes the form of, a laser beam (a focused beam of coherent light). In an example, the first laser light 156 is, or takes the form of, a pulsed laser beam. The pulsed laser beam is formed by pulses of laser energy. In other words, the pulsed laser beam is formed by pulses of laser light that are emitted in the form of a beam.

In some examples, the laser 186 is a laser generator, an array of laser diodes, or some other suitable source of coherent light. In an example, the laser 186 is a low power, or low energy, fiber-based laser. In an example the laser 186 is a gas laser. In an example, the laser 186 is a carbon dioxide ($CO_2$) laser. In an example, the laser 186 is a neodymium-doped yttrium aluminum garnet (Nd:YAG) laser.

In an example, the ultrasound generator 148 is configured to generate the first laser light 156 having number of first properties 166. Each one of the first properties 166 has a value within a selected range. The range for each one of the first properties 166 is selected so that the first laser light 156 is generated in a manner that causes the first ultrasonic waves 234 to be formed in the structure 200 when the first laser light 156 encounters the structure 200 without causing any undesired inconsistencies in the structure 200 outside of selected tolerances. In some examples, the first properties 166 include, but are not limited to, a first wavelength, a first pulse repetition rate, a first spot size, a first pulse duration, a first energy per pulse, a first intensity, and other first properties.

In an example, the laser ultrasound testing system 102 includes ultrasound receiver 150. The ultrasound receiver 150 is configured to generate and emit the second laser light 158. The ultrasound receiver 150 is an example of a combination of a laser source and a detector, such as the laser source 104 and the detector 126 (FIG. 2). The second laser light 158 is an example of receive, or ultrasound detection, laser light, such as the laser light 106 (FIG. 2). In an example, the ultrasound receiver 150 includes, or takes the form of, an interferometer 164. In an example, the interferometer 164 is configured to emit the second laser light 158.

In an example, the second laser light 158 is coherent light. In an example, the ultrasound receiver 150 is configured to generate coherent light. In other words, the interferometer 164 is a coherent light source. In an example, the second laser light 158 is, or takes the form of, a laser beam (a focused beam of coherent light). In an example, the second laser light 158 is, or takes the form of, a pulsed laser beam. The pulsed laser beam is formed by pulses of laser energy. In other words, the pulsed laser beam is formed by pulses of laser light that are emitted in the form of a beam.

In some examples, the interferometer 164 includes a laser generator, an array of laser diodes, or some other suitable source of coherent light. In an example, the interferometer 164 is a low power, or low energy, fiber-based laser. In an example the interferometer 164 includes a gas laser. In an example, the interferometer 164 includes a neodymium-doped yttrium aluminum garnet (Nd:YAG) laser.

In an example, the ultrasound receiver 150 is configured to generate the second laser light 158 having number of second properties 168. Each one of the second properties 168 has a value within a selected range. The range for each one of the second properties 168 is selected so that the second laser light 158 is generated in a manner that does not cause ultrasonic waves to be formed in the structure 200 when the second laser light 158 encounters the structure 200. In some examples, the second properties 168 include, but are not limited to, a second wavelength, a second pulse repetition rate, a second spot size, a second pulse duration, a second energy per pulse, a second intensity, and other second properties.

In some examples, at least some of the first properties 166 of the first laser light 156 and the second properties 168 of the second laser light 158 are different.

In an example, the wavelength of the laser light 106 may be selected based on the materials 244 forming the structure 200, the thickness of the structure 200, and other suitable factors. In an example, the wavelength may be selected for the first laser light 156 in a manner that increases absorption of energy from the first laser light 156 when the first laser light 156 is transmitted onto the surface 202 of the structure 200. For example, when the structure 200 is formed from one or more composite materials, the wavelength selected for the first laser light 156 may be from approximately 300 millimeters to approximately 30,000 millimeters.

Pulse repetition rate is the rate at which the pulses of laser energy are emitted to form the pulsed laser beam. Pulse repetition rate may be described in terms of frequency. In an example, ultrasound generator 148 is configured to generate a pulsed laser beam such that pulsed laser beam has pulse repetition rate between approximately 10,000 hertz and approximately 500,000 hertz. A pulse repetition rate within this range may be considered a high pulse repetition rate. In an example, the selected range for the pulse repetition rate is selected such that the pulse repetition rate is sufficiently high to enable the rate at which the pulsed laser beam is moved along the structure 200 to be within selected tolerances. In particular, a high value for the pulse repetition rate enables the rate at which the pulses laser beam scans the structure 200 to be high as well. In other words, as the pulse repetition rate increases, the scanning rate may also increase.

Spot size is the size of the area on the surface of the structure 200 illuminated by laser light 106, such as the pulsed laser beam. In an example, the laser ultrasound testing system 102 is configured to generate the laser light 106, such as in the form of the pulsed laser beam, such that spot size is less than about 1 millimeter.

In an example, pulse duration, or pulse length, may be selected for the first laser light 156 to generate a desired frequency for the first ultrasonic waves 234. In an example, the pulse duration of approximately 1 nanosecond to approximately 200 nanoseconds may be selected for the first laser light 156 that is used to form the first ultrasonic waves 234. In an example, the pulse duration of approximately 50 microseconds to approximately 100 microseconds may be selected for the second laser light 158 that is used to detect the second ultrasonic waves 238 in the first response 236. Generally, the pulse duration of the first laser light 156 is selected to be sufficiently long so that the first laser light 156 illuminates the surface 202 long enough for an ultrasonic pulse of ultrasonic waves to make a complete round trip through the structure 200.

Energy per pulse may be the amount of energy contained within each pulse of laser energy that forms the laser light 106. In an example, the first laser light 156, such as the pulsed laser beam, is generated such that the energy per pulse is within a range that is selected to enable the first ultrasonic waves 234 to be formed in the structure 200 without causing a number of inconsistencies in the structure 200 outside of selected tolerances. In an example, ultrasound generator 148 is configured to generate first laser light 156, such as the pulsed laser beam, so that the energy per pulse is within the range of approximately 1 microjoule to approximately 10,000 microjoules.

In an example, intensity may be selected based on the amount of energy that is desired to be transmitted into the structure 200 by the first laser light 156 encountering the surface 202 of the structure 200. Intensity may be selected for the first laser light 156 to provide a desired level of first ultrasonic waves 234 when the first laser light 156 is transmitted onto the surface 202 of the structure 200. Intensity may be selected for the first laser light 156 and the second laser light 158 to reduce or avoid damage to the surface 202 of the structure 200. The intensity also may vary depending on the values selected for the pulse length and the spot size.

In some examples, the combination of spot size and energy per pulse may be used to produce an optical fluence within a desired range. As used herein, the term "fluence" refers to the energy transferred through a unit area. In an example, the laser light 106, such as the pulsed laser beam, may be generated such that the optical fluence per pulse ranges between approximately 0.1 millijoules per centimeters squared to approximately 1000 millijoules per centimeters squared. The value within this range selected for the optical fluence per pulse may be selected such that the pulsed laser beam does not cause any inconsistencies on and/or in the structure 200 outside of selected tolerances.

In some examples, the rate at which the laser light 106 scans the structure 200 may be increased by increasing the number of spots 172 over a corresponding area of the surface 202 being scanned (e.g., increasing the density of the pattern 120). Consequently, the data 132 generated when the laser light 106 has a denser pattern 120 and a high repetition rate may have a higher signal-to-noise ratio as compared to when the laser light 106 has a less dense pattern 120 and a lower repetition rate. Generally, a higher pulse repetition rate increases the number of times a point or an area on the surface 202 is illuminated by the laser light 106. Data points of responses from multiple pulses of the laser light 106 on the same point or areas on the surface 202 may be averaged and have a higher signal-to-noise ratio.

Although specific values have been specified for the first properties 166 and/or the second properties 168, these values are presented for purposes of illustration and are not meant to limit other values that may be used. The selection of the first properties 166 and/or the second properties 168 may vary depending on the corresponding light source, the materials in structure 200, and other factors.

In an example, the ultrasound generator 148 is optically coupled with the transmitter 108. The transmitter 108 is configured to transmit the first laser light 156 from the output 110 of the transmitter 108 onto the surface 202 of the structure 200 in the form of a first pattern 160. The first pattern 160 of the first laser light 156 is a plurality of areas on which the first laser light 156 illuminates on the surface 202. The first pattern 160 is an example of the pattern 120 (FIG. 2). In an example, the first pattern 160 takes the form of the line 124 (FIG. 2).

In an example, the ultrasound receiver 150 is optically coupled with the transmitter 108. The transmitter 108 is configured to transmit the second laser light 158 from the output 110 of the transmitter 108 onto the surface 202 of the structure 200 in the form of a second pattern 162. The second pattern 162 of the second laser light 158 is a plurality of areas on which the second laser light 158 illuminates on the surface 202. The second pattern 162 is an example of the pattern 120 (FIG. 2). In an example, the second pattern 162 takes the form of the line 124 (FIG. 2).

In some examples, the second pattern 162 of the second laser light 158 substantially lines up with the first pattern 160 of the first laser light 156. In an example, the line 124 of the first laser light 156 and the line 124 of the second laser light 158 are substantially aligned and/or cover substantially the same area on the surface 202 of the structure 200.

Figure 8:
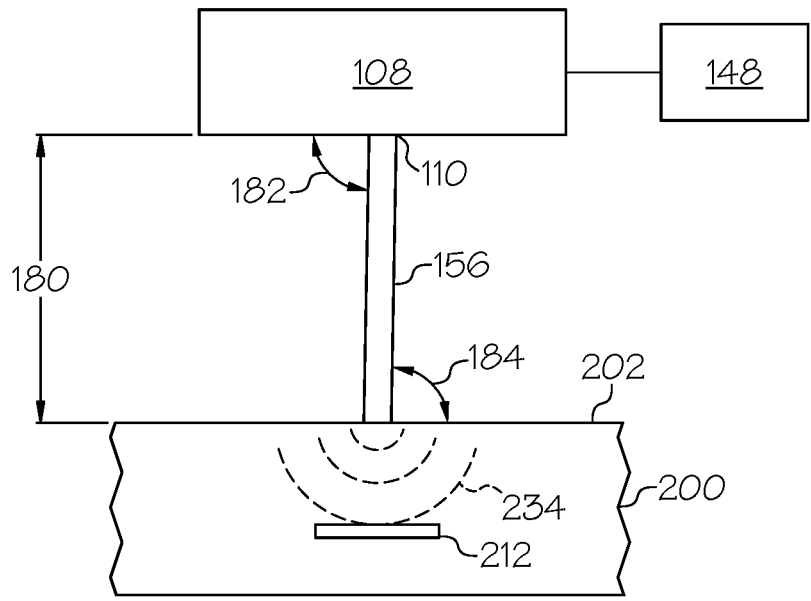
FIG. 8 is a schematic illustration of an example of the laser light transmitted onto the surface of the structure to form ultrasonic waves in the structure.

Referring to FIG. 8, in an example, the first laser light 156 is configured to generate, form, or otherwise create first ultrasonic waves 234 within the structure 200 when the first laser light 156 encounters the structure 200. In other words, the first ultrasonic waves 234 may occur when the first laser light 156 is transmitted onto the surface 202 of the structure 200. Energy in the first laser light 156 causes thermoelastic expansion in the structure 200. The thermoelastic expansions result in the first ultrasonic waves 234 in the structure 200. The first ultrasonic waves 234 are an example of ultrasonic waves 204 (FIG. 2).

In an example, the first ultrasonic waves 234 have a frequency from approximately 20 kilohertz to approximately 10 megahertz, for example, depending upon a particular implementation. For example, the frequency of the first ultrasonic waves 234 may depend on the material 244 (FIG. 2) used to form the structure 200, a pulse width of the laser excitation, and other suitable factors.

Figure 9:
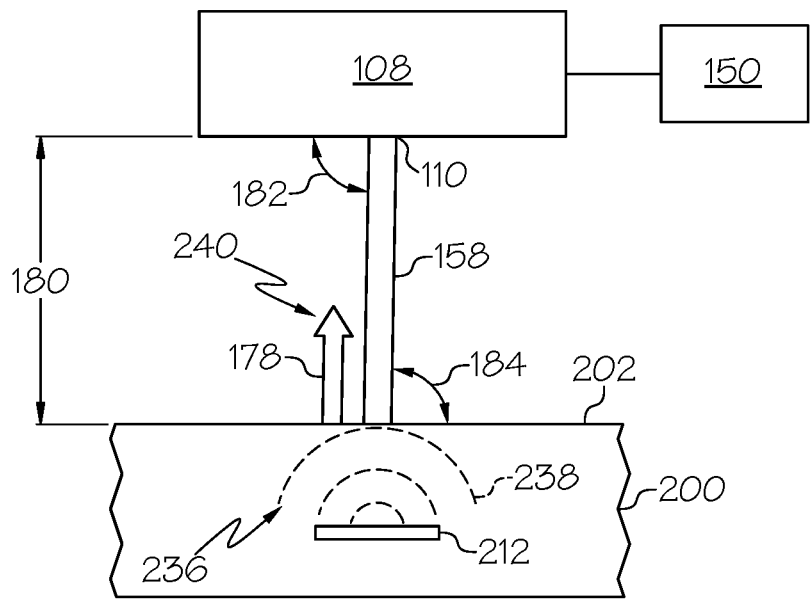
FIG. 9 is a schematic illustration of an example of the laser light transmitted onto the surface of the structure to detect a response to the ultrasonic waves.

Referring to FIG. 9, in an example, the first ultrasonic waves 234 are configured to generate of form a first response 236. In other words, the first response 236 is feedback created by the first ultrasonic waves 234. In an example, the first response 236 includes second ultrasonic waves 238 that occur as a result of scattering, reflection, modulation, and other changes to the first ultrasonic waves 234 (FIG. 8) traveling within the structure 200. In other words, the first response 236 is formed of the second ultrasonic waves 238 that occur in response to the first ultrasonic waves 234. The second ultrasonic waves 238 are an example of ultrasonic waves 204 (FIG. 2). The first response 236 is an example of the response 206 (FIG. 2).

In an example, the first response 236 is detected by transmitting the second laser light 158 onto the surface 202 of the structure 200 and detecting a second response 240 to the second laser light 158. In an example, the second response 240 is third laser light 242 that has been deflected by the first response 236. The third laser light 242 is a portion of the second laser light 158 that is reflected from the surface 202. For example, the second ultrasonic waves 238 (e.g., the first response 236) caused by the first ultrasonic waves 234 traveling within the structure 200 reach the surface 202 of the structure 200 and generate or otherwise form mechanical vibrations on the surface 202, which are detected. The second response 240 is an example of the response 206 (FIG. 2).

In an example, the first response 236 is detected using the ultrasound receiver 150 that sends the second laser light 158 (e.g., reference laser light) and detects the mechanical vibrations on the surface 202 as the second response 240. In an example, the ultrasound receiver 150 sends the data 132 to the computer 114 (FIG. 2) when the second response 240 is detected. The computer 114 uses the data 132 to generate information indicative of whether the inconsistency 212 is present in the structure 200.

In the illustrative examples, the laser ultrasound testing system 102 is used to test portions of the structure 200 in which the surface 202 of the structure 200 has a varying profile shape. The laser ultrasound testing system 102 is also used to test portions of the structure 200 in which non-planar features are present. Non-planar features may include, but are not limited to, at least one of a radius, an edge, a groove, and other non-planar features.

As illustrated in FIGS. 8 and 9, during the laser ultrasound testing operation, the output 110 of the transmitter 108 is positioned at a predefined offset distance 180 relative to the surface 202 of the structure 200. As the first laser light 156 and the second laser light 158 are moved across the surface 202 of the structure 200 along the scan path 116 (FIG. 2), the output 110 of the transmitter 108 is maintained at a substantially constant offset distance 180 relative to the surface 202.

In an example, the offset distance 180 refers to the linear distance between the surface 202 of the structure 200 and the output 110 of the transmitter 108. In other words, the offset distance 180 represents the distance the laser light 106 travels from the transmitter 108 to the surface 202 within an acceptable tolerance. In an example, the offset distance 180 between the output 110 of the transmitter 108 and the surface 202 of the structure 200 is between approximately 9 millimeters and approximately 11 millimeters. In an example, the offset distance 180 is approximately 10 millimeters. Other offset distances 180 may be used when positioning the output 110 of the transmitter 108 depending on the particular implementation. As the first laser light 156 and the second laser light 158 are moved across the surface 202 of the structure 200 along the scan path 116 (FIG. 2), the output 110 of the transmitter 108 is maintained at a substantially constant offset distance 180 relative to the surface 202 of the structure 200.

During the laser ultrasound testing operation, transmission of each one of the first laser light 156 and the second laser light 158 from the output 110 of the transmitter 108 is oriented at a predefined angle of projection 182 relative to a reference frame, such as the reference frame 118 of the testing environment 100, the transmitter reference frame 136, or the structure reference frame 210. As the first laser light 156 and the second laser light 158 are moved across the surface 202 of the structure 200 along the scan path 116 (FIG. 2), each one of the first laser light 156 and the second laser light 158 is maintained at a substantially constant angle of projection 182 relative to a corresponding reference frame.

As used herein, the angle of projection 182 refers to the angular orientation of the laser light 106 (e.g., the first laser light 156 and the second laser light 158) relative to the corresponding reference frame that achieves a desired angle of impingement 184 between the laser light 106 and the surface 202 of the structure 200 within an acceptable tolerance. In an example, angle of impingement 184 is between approximately 88-degrees and approximately 92-degrees. In an example, the angle of impingement 184 is approximately 90-degrees.

Figure 10:
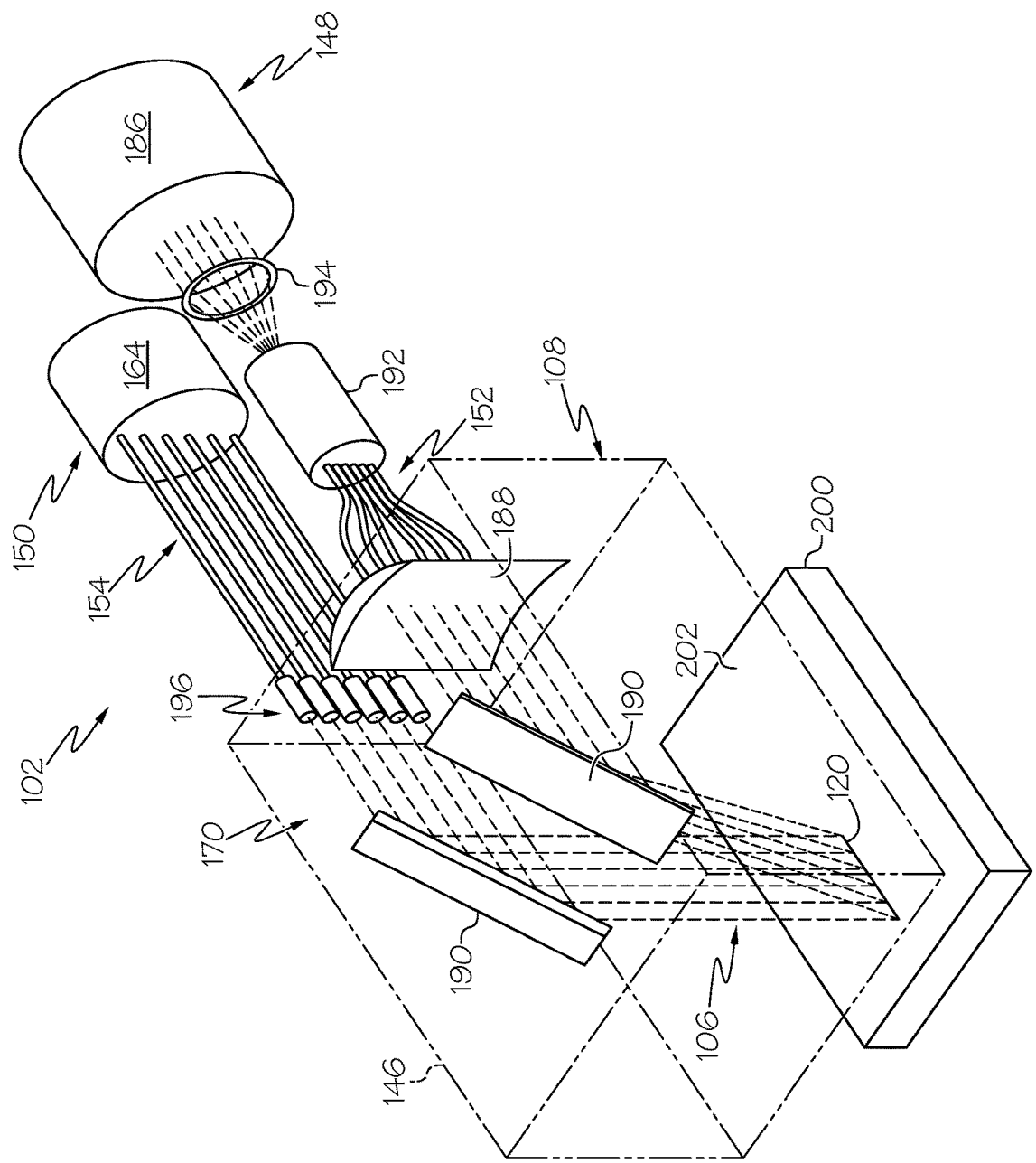
FIG. 10 is a schematic illustration of a portion of an example of the laser ultrasound testing system.

Referring to FIG. 10, in an example, the transmitter 108 also includes a transmitter housing 146. In an example, the transmitter housing 146 includes a frame or some other type of physical structure. The transmitter housing 146 is depicted by broken lines in FIG. 10. In an example, the transmitter housing 146 takes the form of the end effector 128 and is configured to be coupled to the robot 122 (FIG. 4).

In the illustrative example, the ultrasound generator 148 and the ultrasound receiver 150 are associated with the transmitter 108. The ultrasound generator 148 is configured to optically transmit the laser light 106 (e.g., the first laser light 156) to the transmitter 108. The ultrasound receiver 150 is configured to optically transmit the laser light 106 (e.g., the second laser light 158) to the transmitter 108. The ultrasound receiver 150 is also configured to detect the response 206 to the ultrasonic waves 204 (FIG. 2).

In an example, the laser ultrasound testing system 102 includes a first array of optical fibers 152. The first array of optical fibers 152 includes a plurality of optical fibers arranged in an array. The optical fibers of the first array of optical fibers 152 may be implemented using any type of optical fiber that is configured to carry light within the optical fibers. Any number of optical fibers and/or other types of arrays may be used for the first array of optical fibers 152.

The first array of optical fibers 152 optically couple the ultrasound generator 148 and the transmitter 108 together. The first array of optical fibers 152 is configured to receive the first laser light 156 from the ultrasound generator 148 and transmit the first laser light 156 from the output 110 of the transmitter 108 in the form of the first pattern 160 onto the surface 202 of the structure 200. The first laser light 156 from the first array of optical fibers 152 is configured to cause excitation in the structure 200. In other words, the first laser light 156 from the first array of optical fibers 152 is configured to generate the first ultrasonic waves 234 within the structure 200.

In an example, the laser ultrasound testing system 102 includes a second array of optical fibers 154. The second array of optical fibers 154 includes a plurality of optical fibers arranged in an array. The optical fibers of the second array of optical fibers 154 may be implemented using any type of optical fiber that is configured to carry light within the optical fibers. Any number of optical fibers and/or other types of arrays may be used for the second array of optical fibers 154.

The second array of optical fibers 154 optically couple the ultrasound receiver 150 and the transmitter 108 together. The second array of optical fibers 154 is configured to receive the second laser light 158 from the ultrasound receiver 150 and transmit the second laser light 158 from the output 110 of the transmitter 108 in the form of the second pattern 162 onto the surface 202 of the structure 200. The second array of optical fibers 154 is configured to receive (e.g., detect) the second response 240 (FIG. 9) to the second laser light 158. The second laser light 158 is not configured to generate ultrasonic waves within the structure 200. Instead, the second laser light 158 is configured to reflect, scatter, or otherwise interact with the surface 202 of the structure 200, the air around the surface 202 of the structure 200, or both in a manner such that the portion of second laser light 158 that is reflected back to and received by the second array of optical fibers 154 (e.g., the third laser light 178) may be affected by the second ultrasonic waves 238 in the first response 236 that reach the surface 202 of the structure 200.

In some examples, overlap is present in the time between the first pattern 160 and the second pattern 162 being transmitted onto the surface 202. With this overlap, the second array of optical fibers 154 may be used to monitor for the first response 236 at the same time or prior to the generation of the first ultrasonic waves 234.

In other examples, each optical fiber in the first array of optical fibers 152 may transmit the first laser light 156 sequentially rather than at the same time. Additionally, groupings of the optical fibers in the first array of optical fibers 152 may sequentially transmit the first laser light 156. The second laser light 158 may be transmitted in a similar fashion by the second array of optical fibers 154. In other examples, the first laser light 156 and the second laser light 158 may be transmitted using different phases, wavelengths, or both.

In some examples, mechanisms such as delay lines and delay circuits separate laser light sources in the ultrasound generator 148 and/or the ultrasound receiver 150. These mechanisms may reduce cross talk in the optical fibers that results in the first laser light 156 in the first array of optical fibers 152 and the second laser light 158 in the second array of optical fibers 154 from exiting one optical fiber and entering another optical fiber. In other words, different phases, wavelengths, timings, or some combination thereof may be used to reduce cross talk between the optical fibers within the first array of optical fibers 152 and the second array of optical fibers 154.

In an example, the transmitter 108 also includes a number of optical elements 170. The optical elements 170 are configured to direct and/or modify the transmission of the first laser light 156 and the second laser light 158 from the output 110 of the transmitter 108 onto the surface 202 of the structure 200. Further, the optical elements 170 may also direct the second response 240 (e.g., the third laser light 178) to the second array of optical fibers 154. In some examples, the optical elements 170 include at least one of a lens, a mirror, a diffractive optical element, a polarizer, a wave plate, a periodically-poled Lithium niobate crystal, or other suitable optical elements.

In an example, the optical elements 170 are configured to shape the first laser light 156 transmitted from the first array of optical fibers 152 to form the first pattern 160. In a similar fashion, the optical elements 170 are configured to shape the second laser light 158 transmitted from the second array of optical fibers 154 to form the second pattern 162. In some examples, the optical elements 170 may be used to change the polarization of the first laser light 156 and/or the second laser light 158, the color of first laser light 156 and/or the second laser light 158, and other parameters of the first laser light 156 and/or the second laser light 158.

In an example, the optical elements 170 include a cylinder lens 188. The cylinder lens 188 is configured to cause the first laser light 156 transmitted by the first array of optical fibers 152 to form beams that have a linear shape. In other words, the cylinder lens 188 is configured to shape the first laser light 156. In an example, the cylinder lens 188 is configured to cause the first laser light 156 to form the first pattern 160 on the surface 202 of the structure 200 as a continuous line. In an example, the cylinder lens 188 may function to cause the first pattern 160 of the first laser light 156 to have an intensity with a Gaussian profile. In an example, the Gaussian profile is in an X and Y direction relative to a plane on the surface 202 of the structure 200.

In an example, the first array of optical fibers 152 are spaced apart so that the first pattern 160 illuminates a pattern of individual areas on the surface 202 of the structure 200. In an example, the first array of optical fibers 152 and/or the optical elements 170 are configured to transmit the first laser light 156 from the output 110 of the transmitter 108 as a first array of laser beams, such as a first array of pulsed laser beams.

In an example, the first pattern 160 takes the form of the line 124 (FIG. 4). In an example, the first pattern 160 is formed from the intersection or overlapping of first array of laser beams on the surface 202 of the structure 200.

In an example, the second array of optical fibers 154 are spaced apart so that the second pattern 162 illuminates a pattern of individual areas on the surface 202 of the structure 200. In an example, the second array of optical fibers 154 and/or the optical elements 170 are configured to transmit the second laser light 158 from the output 110 of the transmitter 108 as a second array of laser beams, such as a second array of pulsed laser beams.

In an example, the second pattern 162 takes the form of the line 124 (FIG. 4). In an example, the second pattern 162 is formed from the intersection or overlapping of second array of laser beams on the surface 202 of the structure 200.

In an example, the optical elements 170 include number of mirrors 190. The mirrors are configured to manage the direction in which the first array of laser beams of the first laser light 156 and/or the second array of laser beams of the second laser light 158 travel to reach the surface 202 of the structure 200. The mirrors 190 are also configured to control the direction in which the third laser light 178 of the second response 240 travels.

In an example, the optical fibers of the first array of optical fibers 152 may be grouped and covered to form a fiber bundle 192. In an example, an end of the fiber bundle 192 is optically coupled with a collimator 194. In an example, the collimator 194 is optically coupled with the laser 186. In an example, the first laser light 156 is sent through the collimator 194. The collimator 194 is configured to make the first laser light 156 coherent.

In another example, the ultrasound generator 148 includes number of collimators 194. In an example, each one of the optical fibers of the first array of optical fibers 152 is optically coupled with a corresponding one of the collimators 194.

In an example, the interferometer 164 is a hardware device and is configured to identify information from the third laser light 178 forming the second response 240 (FIG. 9). In an example, interferometer 164 may include a number of interferometers. The information identified by the interferometer 164 may include, for example, displacements, deflections, surface velocity, and other information that may be used to identify the second response 240 as detected by the second array of optical fibers 154 that receive the third laser light 178 in the second response 240.

In an example, the ultrasound receiver 150 also includes number of collimators 196. In an example, each one of the optical fibers of the second array of optical fibers 154 is optically coupled with a corresponding one of the collimators 196. In an example, the collimators 196 may be implemented using different types of collimators. For example, the collimators 196 may be selected from at least one of an aspherical lens collimator, a spherical lens collimator, a grin lens collimator, or some other suitable type of collimator. The collimators 196 are configured to make the second laser light 158 coherent.

In an example, the third laser light 242 in the second response 240 is received, or detected, at one end of the second array of optical fibers 154 and are transmitted through the second array of optical fibers 154 in a direction opposite to the transmission of the second laser light 158. In an example, an opposing end of the second array of optical fibers 154 is coupled to the interferometer 164. In this example, the interferometer 164 is the source of the second laser light 158 and receives the second response 240.

The present disclosure recognizes that in order to maintain a substantially constant offset distance 180 and angle of projection 182 of the laser light 106 as the laser light 106 moves across the surface 202 of the structure 200 along the scan path 116, the profile shape of the surface 202 and/or the three-dimensional position 208 of the surface 202 relative to the reference frame 118 needs to be understood.

Referring again to FIG. 2, in an example, the computer 114 is configured to utilize three-dimensional point cloud data 248 to identify the three-dimensional position 208 of the plurality of points 222 on the surface 202 of the structure 200. In an example, the three-dimensional position 208 of the plurality of points 222 on the surface 202 is identified relative to the structure reference frame 210. In this example, the computer 114 is also configured to position the three-dimensional position 208 of the plurality of points 222 on the surface 202 relative to the reference frame 118. In an example, the computer 114 is configured, for example, by execution of instructions or implementation of a software tool, to perform a transformation operation on the structure reference frame 210 so that the structure reference frame 210 is aligned with the reference frame 118 and the three-dimensional position 208 of the plurality of points 222 on the surface 202 are positioned relative to the reference frame 118.

In various examples, the three-dimensional point cloud data 248 representative of the surface 202 of the structure 200 is generated by any one of a variety of methods. In an example, the computer 114 is configured to extract the three-dimensional point cloud data 248 representative of the surface 202 of the structure 200 from a three-dimensional model 246 of the structure 200. In an example, based on the three-dimensional point cloud data 248 of the surface 202, the computer 114 is also configured to determine the three-dimensional position 208 of the plurality of points 222 on the surface 202 relative to the reference frame 118.

In various examples, the three-dimensional model 246 of the structure 200 is generated by any one of a variety of different methods. In an example, the three-dimensional model 246 is generated using a computer-aided design (CAD) tool or software that is implemented on a computer, such as the processor 140 of the computer 114 or another computer system.

In an example, the three-dimensional model 246 is generated using number of images 250. In various examples, the images 250 of the structure 200 are generated by any one of a variety of different methods. In an example, the laser ultrasound testing system 102 is configured to capture the images 250 of the structure 200. In an example, the images 250 are captured prior to commencement of the ultrasound testing operation. In an example, the images 250 are captured during performance of the ultrasound testing operation, for example, as the laser light 106 is moved across the surface 202 to scan the structure 200.

In an example, the laser ultrasound testing system 102 includes a sensor 198. The sensor 198 is configured to capture the images 250 of the structure 200. In an example, the computer 114 is configured to generate the three-dimensional model 246 of the structure 200 from the images 250 of the structure 200. In another example, the computer 114 is configured, for example, by execution of instructions or implementation of a software tool, to extract the three-dimensional point cloud data 248 representative of the surface 202 of the structure 200 directly from the images 250 of the structure 200.

In an example, the sensor 198 includes a sensor housing. The sensor housing includes a frame or some other type of physical structure. In an example, the sensor 198 takes the form of a portion of the end effector 128 or is otherwise configured to be coupled to the transmitter 108 or the robot 122 (FIG. 4).

The sensor 198 includes any one of a variety of types of image capture systems. In an example, the sensor 198 includes, or takes the form of, a type of stereo vision system. In an example, the sensor 198 includes, or takes the form of a type of structured-light system. In an example, the sensor 198 includes, or takes the form of a three-dimensional laser scanner or other type of laser metrology system.

In an example, the sensor 198 includes a number of cameras. In an example, the number of cameras is configured to capture the images 250 in the form of a number of two-dimensional images.

In an example, the sensor 198 includes a number of light sources. The number of light sources is configured to illuminate a portion of the surface 202 of the structure 200. In an example, the number of light sources is configured to transmit structured light onto the surface 202 of the structure 200. The number of cameras is configured to capture the number of images 250 of the surface 202 and the structured light that is reflected from the surface 202.

In an example, the processor 140 of the computer 114 is configured, for example, by execution of instructions or implementation of a software tool, to receive the number of images 250 and to determine a change in profile shape of the surface 202 of the structure 200 based on one or more image processing operations. In an example, this image processing operation is performed using a software tool that is implemented on a computer, such as the processor 140 of the computer 114 or another computer system.

Determining the profile shape of the surface 202 of the structure 200 may be achieved by any other suitable optical means. In an example, the sensor 198 includes, or takes the form of, a laser metrology device that uses a point cloud method that measures the plurality of points 222 of the surface 202 in three-dimensional space. The three-dimensional position 208, or the profile shape, of the surface 202 of the structure 200 is extracted from the three-dimensional point cloud data 248. In an example, each one of the points 222 is measured with a laser range finder. In an example, the sensor 198 includes, or takes the form of, profilometer that measures the profile of the surface 202 of the structure 200 using a laser line scan. A laser line scan system generates a two-dimension profile of the surface 202 along a line.

Positioning the laser light 106 on the surface 202 during scanning includes moving the transmitter 108, for example, using the movement mechanism 112, relative to the structure 200 to move the laser light 106 along the scan path 116. In some examples, the scan path 116 is a dynamically calculated path that is generated using inputs from the sensor 198, a preplanned path based on the three-dimensional model 246 (e.g., a CAD description) of the structure 200, or a combination of the two. The present disclosure recognizes that a physical structure, particularly a composite structure, may vary from a CAD description of the structure.

Figure 11:
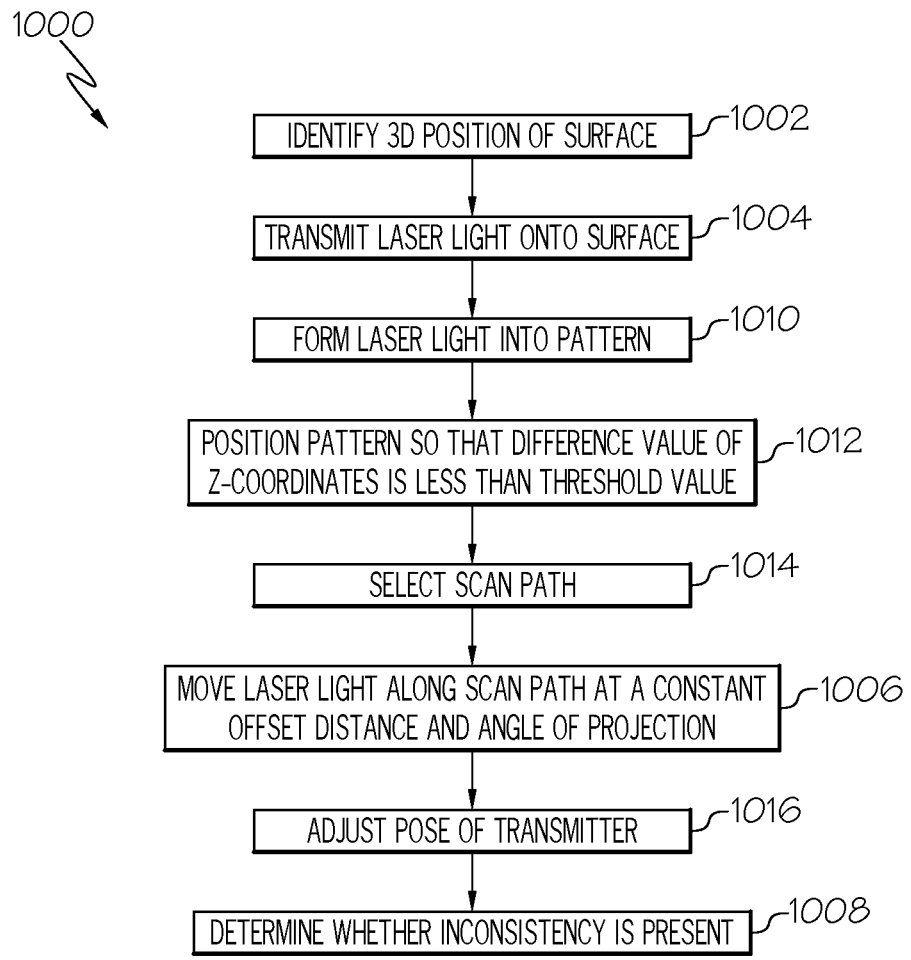
FIG. 11 is a flow diagram of an example of a method for testing the structure using laser ultrasound.

Referring to FIG. 11, also disclosed is an example method 1000 for testing a structure using laser ultrasound. For example, the disclosed method 1000 is used to test the structure 200 using the laser ultrasound testing system 102.

In an example, the method 1000 includes a step of identifying the three-dimensional position 208 of the surface 202 of the structure 200 relative to the reference frame 118 (Block 1002).

In an example, the method 1000 includes the step of transmitting the laser light 106 from the output 110 of the transmitter 108 onto the surface 202 of the structure 200 to form the ultrasonic waves 204 in the structure 200 and to detect the response 206 to the ultrasonic waves 204 (Block 1004).

In an example, the method 1000 includes a step of, based on the three-dimensional position 208 of the surface 202, moving the laser light 106 over the structure 200 along the scan path 116 so that the output 110 of the transmitter 108 is located at a constant offset distance 180 from the surface 202 and that the laser light 106, transmitted from the output 110 of the transmitter 108, is directed onto the surface 202 at a constant angle of projection 182 (Block 1006).

In an example, the method 1000 includes a step of, based on the response 206 to the ultrasonic waves 204, determining whether the inconsistency 212 is present in the structure 200 (Block 1008).

Figure 12:
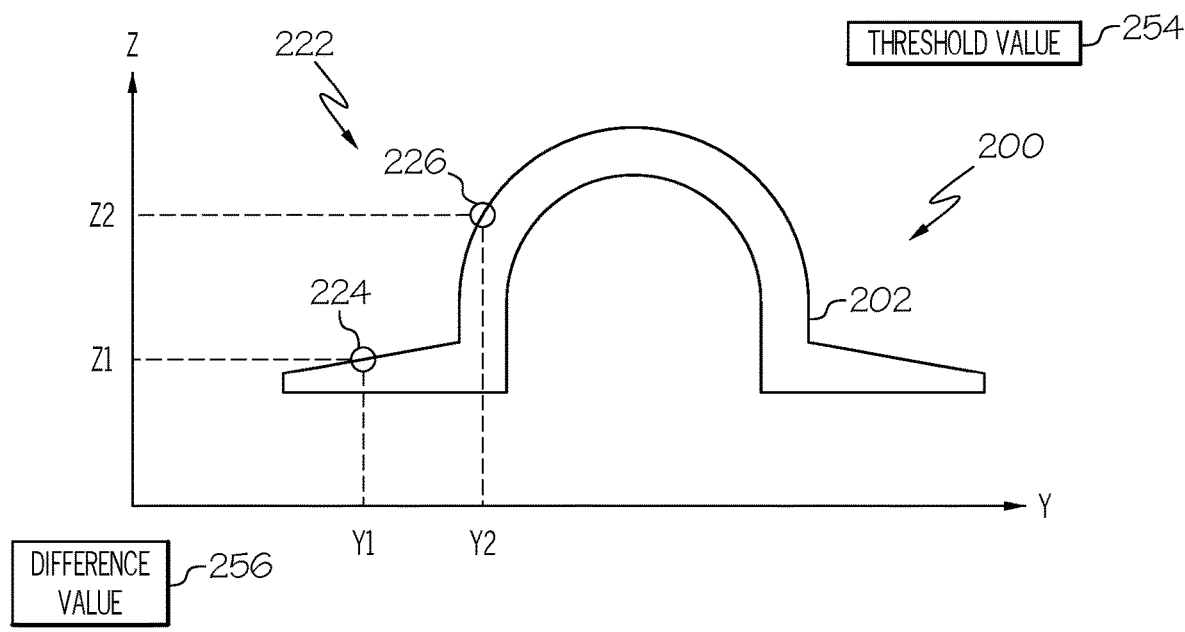
FIG. 12 is a schematic illustration of an example of a three-dimensional position of a surface of the structure relative to a reference frame.
Figure 13:
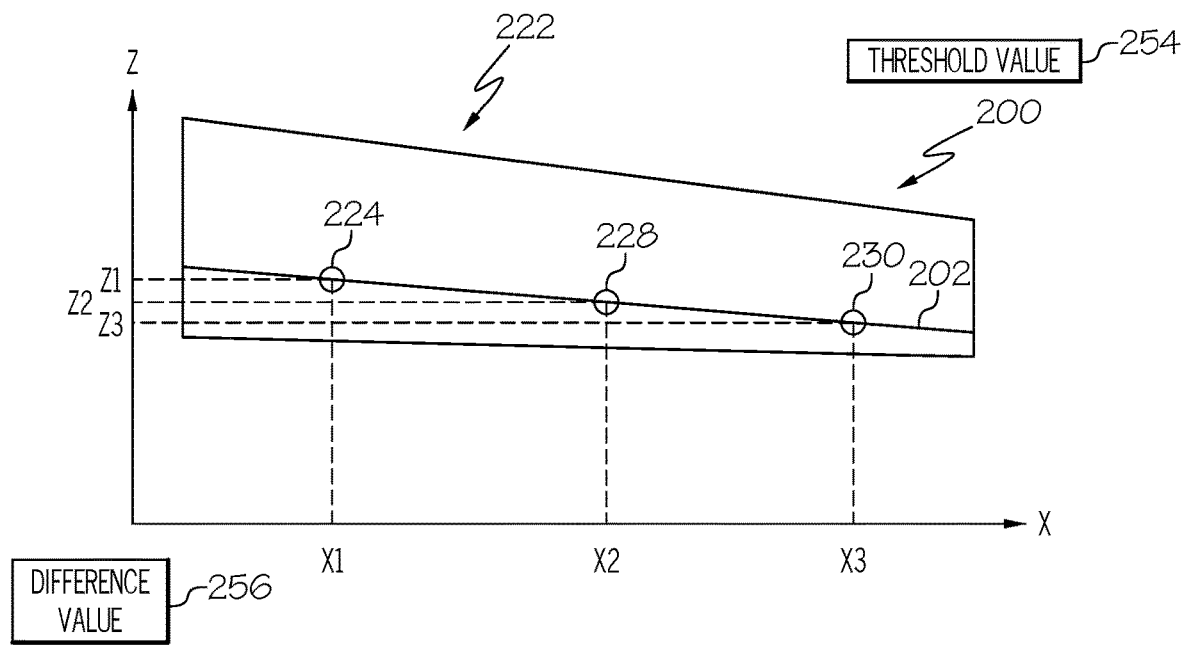
FIG. 13 is a schematic illustration of an example of a three-dimensional position of the surface of the structure relative to the reference frame.

Referring to FIGS. 12 and 13, in an example, each one of the plurality of points 222 on the surface 202 has a corresponding three-dimensional position 208 relative to the reference frame 118. The three-dimensional position 208 includes a XYZ-coordinate in the reference frame 118. A Z-coordinate of one of the plurality of points 222 on the surface 202 is different than the Z-coordinate of another one of the plurality of points 222 on the surface 202.

In an example, and as illustrated in FIG. 12, the first point 224 (e.g., a first one of the plurality of points 222) has a first XYZ-coordinate and the second point 226 (e.g., a second one of the plurality of points 222) has a second XYZ-coordinate. The first point 224 has a first Z-coordinate (Z1) and the second point 226 has a second Z-coordinate (Z2). The first Z-coordinate (Z1) and the second Z-coordinate (Z2) are different. A difference value 256 of the first Z-coordinate (Z1) and the second Z-coordinate (Z2) represents a change in the profile shape of the surface 202 along the Y-axis between a first Y-coordinate (Y1) and a second Y-coordinate (Y2) in the YZ-plane of the reference frame 118.

In an example, and as illustrated in FIG. 13, the first point 224 (e.g., a first one of the plurality of points 222) has a first XYZ-coordinate, the third point 228 (e.g., a second one of the plurality of points 222) has a second XYZ-coordinate, and the fourth point 230 has a third XYZ-coordinate. The first point 224 has a first Z-coordinate (Z1), the third point 228 has a second Z-coordinate (Z2), and the fourth point 230 has a third Z-coordinate (Z3). The first Z-coordinate (Z1), the second Z-coordinate (Z2), and the third Z-coordinate (Z3) are different. A difference value 256 of the first Z-coordinate (Z1) and the second Z-coordinate (Z2) represents a change in the profile shape of the surface 202 along the X-axis between a first X-coordinate (X1) and a second X-coordinate (X2) in the XZ-plane of the reference frame 118. A difference value 256 of the second Z-coordinate (Z2) and the third Z-coordinate (Z3) represents a change in the profile shape of the surface 202 along the X-axis between a second X-coordinate (X2) and a third X-coordinate (X3) in the XZ-plane of the reference frame 118. A difference value 256 of the first Z-coordinate (Z1) and the third Z-coordinate (Z3) represents a change in the profile shape of the surface 202 along the X-axis between a first X-coordinate (X1) and a third X-coordinate (X3) in the XZ-plane of the reference frame 118.

Referring to FIG. 11, in an example, the method 1000 includes a step of forming the laser light 106, transmitted from the output 110 of the transmitter 108, into the pattern 120 on the surface 202 of the structure 200 (Block 1010).

In an example, the method 1000 includes a step of positioning the pattern 120 on the surface 202 so that a difference value 256 of Z-coordinates of any two of the plurality of points 222 on the surface 202, which are located inclusively within the pattern 120 of the laser light 106, is less than or equal to a threshold value 254 (Block 1012).

In an example, according to the method 1000, the threshold value 254 is less than or equal to approximately one-eighth of an inch (3 millimeters). In other examples, the threshold value 254 may be greater than one-eighth of an inch. The threshold value 254 may depend on various factors, such as the type of materials 244 of the structure 200, the type of laser source 104 used to generate the laser light 106, the properties of the laser light 106, and other factors.

Generally, the threshold value 254 represents the maximum allowable difference value 256, representing the change in the profile shape of the surface 202 over a distance (e.g., the slope of the surface 202), in which the laser light 106 in the form of the pattern 120 of the laser light 106 can be accurately used to generate the data 132 characterizing the structure 200. For example, in a condition in which the difference value 256 of any two of the plurality of points 222, located inclusively within the pattern 120 of the laser light 106, is greater than the threshold value 254, the offset distance 180 and/or the angle of projection 182 may not remain constant for the laser light 106 across the pattern 120 of the laser light 106.

In an example, according to the method 1000 the pattern 120 of the laser light 106 takes the form of the line 124 of the laser light 106.

In an example, the method 1000 includes a step of identifying a first one of the plurality of points 222 on the surface 202 and a second one of the plurality of points 222 on the surface 202 in which the difference value 256 of the Z-coordinates in the reference frame 118 of any two of the plurality of points 222 on the surface 202, which are located inclusively along a straight line 258 that extends between the first one of the plurality of points 222 and the second one of the plurality of points 222, is less than or equal to the threshold value 254.

In an example, the method 1000 includes a step of aligning the line 124 of the laser light 106 with the straight line 258, extending between the first one of the plurality of points 222 and the second one of the plurality of points 222.

Figure 14:
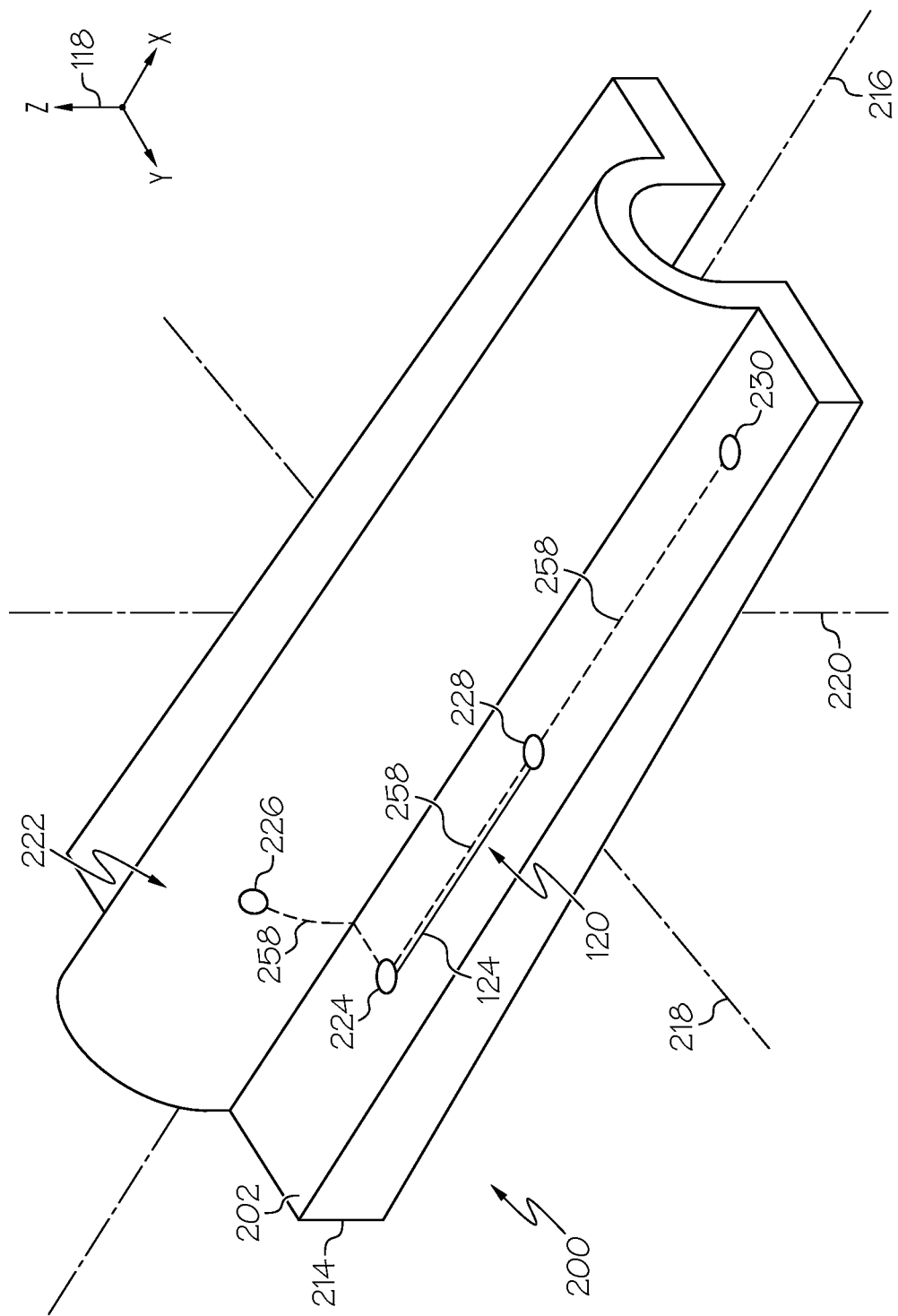
FIG. 14 is a schematic illustration of an example of the pattern of the laser light transmitted onto the surface of the structure.

Referring to FIG. 14, in an example, the straight line 258 is generated that extends between the first point 224 (e.g., a first one of the plurality of points 222) and the second point 226 (e.g., a second one of the plurality of points 222). In this example, a difference value 256 of the Z-coordinates any two of the plurality of points 222 that are located inclusively along the straight line 258, extending between the first point 224 and the second point 226, is greater than the threshold value 254. Therefore, the line 124 of the laser light 106 would not be aligned with the straight line 258, extending between the first point 224 and the second point 226, to scan the structure 200. In an example, the straight line 258 is generated that extends between the first point 224 (e.g., a first one of the plurality of points 222) and the fourth point 230 (e.g., a second one of the plurality of points 222). In this example, a difference value 256 of the Z-coordinates any two of the plurality of points 222 that are located inclusively along the straight line 258, extending between the first point 224 and the fourth point 230, is greater than the threshold value 254. Therefore, the line 124 of the laser light 106 would not be aligned with the straight line 258, extending between the first point 224 and the fourth point 230, to scan the structure 200. In an example, the straight line 258 is generated that extends between the first point 224 (e.g., a first one of the plurality of points 222) and the third point 228 (e.g., a second one of the plurality of points 222). In this example, a difference value 256 of the Z-coordinates any two of the plurality of points 222 that are located inclusively along the straight line 258, extending between the first point 224 and the third point 228, is less than the threshold value 254. Therefore, the line 124 of the laser light 106 would be aligned with the straight line 258, extending between the first point 224 and the third point 228, to scan the structure 200.

In an example, the method 1000 includes a step of fitting the line 124 of the laser light 106 inclusively between the first one of the plurality of points 222 and the second one of the plurality of points 222.

In an example, the line 124 may be sized, for example, by setting and/or adjusting the first linear dimension 174 of the pattern 120 of the laser light 106 so that the first linear dimension 174 of the pattern 120 of the laser light 106 is less than or equal to the linear dimension of the straight line 258, extending between the first one of the plurality of points 222 and the second one of the plurality of points 222, such as the straight line 258, extending between the first point 224 and the third point 228.

In an example, the method 1000 includes a step of identifying a third one of the plurality of points 222 on the surface 202 and a fourth one of the plurality of points 222 on the surface 202 in which the difference value 256 of the Z-coordinates in the reference frame 118 of any two of the plurality of points 222 on the surface 202, which are located inclusively along a second straight line 260 that extends between the third one of the plurality of points 222 and the fourth one of the plurality of points 222, is less than or equal to the threshold value.

Referring to FIG. 11, in an example, the method 1000 includes a step of selecting the scan path 116 of the laser light 106 between the straight line 258, extending between the first one of the plurality of points 222 and the second one of the plurality of points 222, and the second straight line 260, extending between the third one of the plurality of points 222 and the fourth one of the plurality of points 222 (Block 1014).

In an example, the method 1000 includes a step of moving the line 124 of the laser light 106 across the surface 202 along the scan path 116.

In an example, the method 1000 includes a step of aligning the line 124 of the laser light 106 with the second straight line 260, extending between the third one of the plurality of points 222 and the fourth one of the plurality of points 222.

Figure 15:
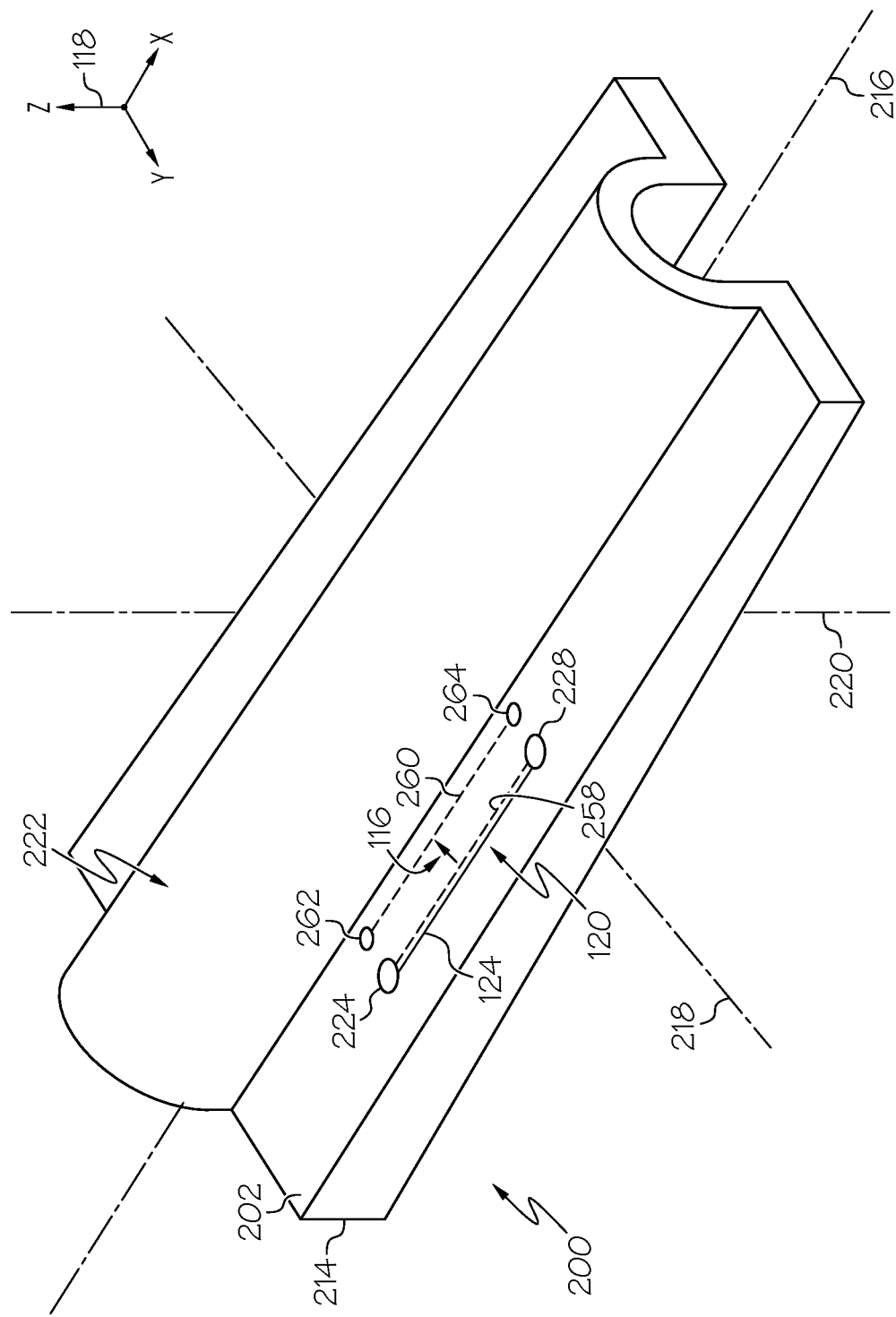
FIG. 15 is a schematic illustration of an example of the pattern of the laser light transmitted onto the surface of the structure.

Referring to FIG. 15, in an example, the second straight line 260 is generated that extends between a fifth point 262 on the surface 202 (e.g., a third one of the plurality of points 222) and a sixth point 264 on the surface 202 (e.g., a fourth one of the plurality of points 222). In this example, a difference value 256 of the Z-coordinates any two of the plurality of points 222 that are located inclusively along the second straight line 260, extending between the fifth point 262 and the sixth point 264, is less than the threshold value 254. Therefore, the line 124 of the laser light 106 would be moved across the surface 202 along the scan path 116 so that the line 124 of the laser light 106 is aligned with the second straight line 260, extending between the fifth point 262 and the sixth point 264, to further scan the structure 200.

In an example, the computer 114 is configured, for example, by execution of instructions or implementation of a software tool, to generate the scan path 116. In an example, the processor 140 of the computer 114 is configured, for example, by execution of instructions or implementation of a software tool, to calculate the scan path 116. In an example, the processor 140 is configured, for example, by execution of instructions or implementation of a software tool, to calculate a vector of the scan path 116 relative to the reference frame 118. In an example, the scan path 116 is determined based at least in part on the calculated difference values 256 of the plurality of points 222 on the surface 202 using the three-dimensional positions 208 of the plurality of points 222, the first linear dimension 174 of the pattern 120 of the laser light 106, a predefined offset distance 180, the predefined angle of projection 182, and other factors.

The scan path 116 that the laser light 106 travels to properly test the structure 200 is generally pre-determined. In an example, a preliminary scan path is generated based on the type of structure 200. The final scan path 116 is generated by adjusting the preliminary scan path based on the three-dimensional model 246 (e.g., CAD description) of the structure 200, the real-time part geometry generated by the sensor 198, the dimensions and/or density of the pattern 120 of the laser light 106, the spacing of the laser ultrasound elements, the maximum speed the ultrasound physics allows (e.g., the time for sound to transit the part), and other factors.

Referring to FIG. 11, in an example, the method 1000 includes a step of adjusting a pose of the transmitter 108 so that the output 110 of the transmitter 108 is located at the constant offset distance 180 from the surface 202 and that the laser light 106, transmitted from the output 110 of the transmitter 108, is directed onto the surface 202 at the constant angle of projection 182 as the line 124 of the laser light 106 moves across the surface 202 along the scan path 116 between the straight line 258, extending between the first one of the plurality of points 222 and the second one of the plurality of points 222, and the second straight line 260, extending between the first one of the plurality of points 222 and the second one of the plurality of points 222 (Block 1016).

In an example, the computer 114 is configured, for example, by execution of instructions or implementation of a software tool, to ascertain the pose of the transmitter 108 relative to the reference frame 118 of the testing environment 100. In an example, the processor 140 is configured, for example, by execution of instructions or implementation of a software tool, to calculate differences in position and/or orientation of the transmitter reference frame 136 relative to the reference frame 118 and/or the structure reference frame 210 and to determine the pose of the transmitter 108 based on the position and/or orientation of the transmitter reference frame 136 in the reference frame 118. In an example, the processor 140 is configured, for example, by execution of instructions or implementation of a software tool, to calculate the appropriate pose of the transmitter 108 as the transmitter 108 moves relative to the surface 202 of the structure 200 to maintain the constant offset distance 180 and the constant angle of projection 182 as the line 124 of the laser light 106 moves along the scan path 116. In an example, the controller 138 is configured to control movement of the movement mechanism 112 to adjust the pose of the transmitter 108 as the line 124 of the laser light 106 moves along the scan path 116.

Referring to FIG. 15, in an example, according to the method 1000, the structure 200 includes, or takes the form of, the stiffener 214. The stiffener 214 is a part of the aircraft 1200 (FIG. 1). The stiffener 214 includes the first axis 216. Each one of the straight line 258, extending between the first one of the plurality of points 222 and the second one of the plurality of points 222, and the second straight line 260, extending between the third one of the plurality of points 222 and the fourth one of the plurality of points 222 is oriented parallel to the first axis 216 of the stiffener 214.

Figure 16:
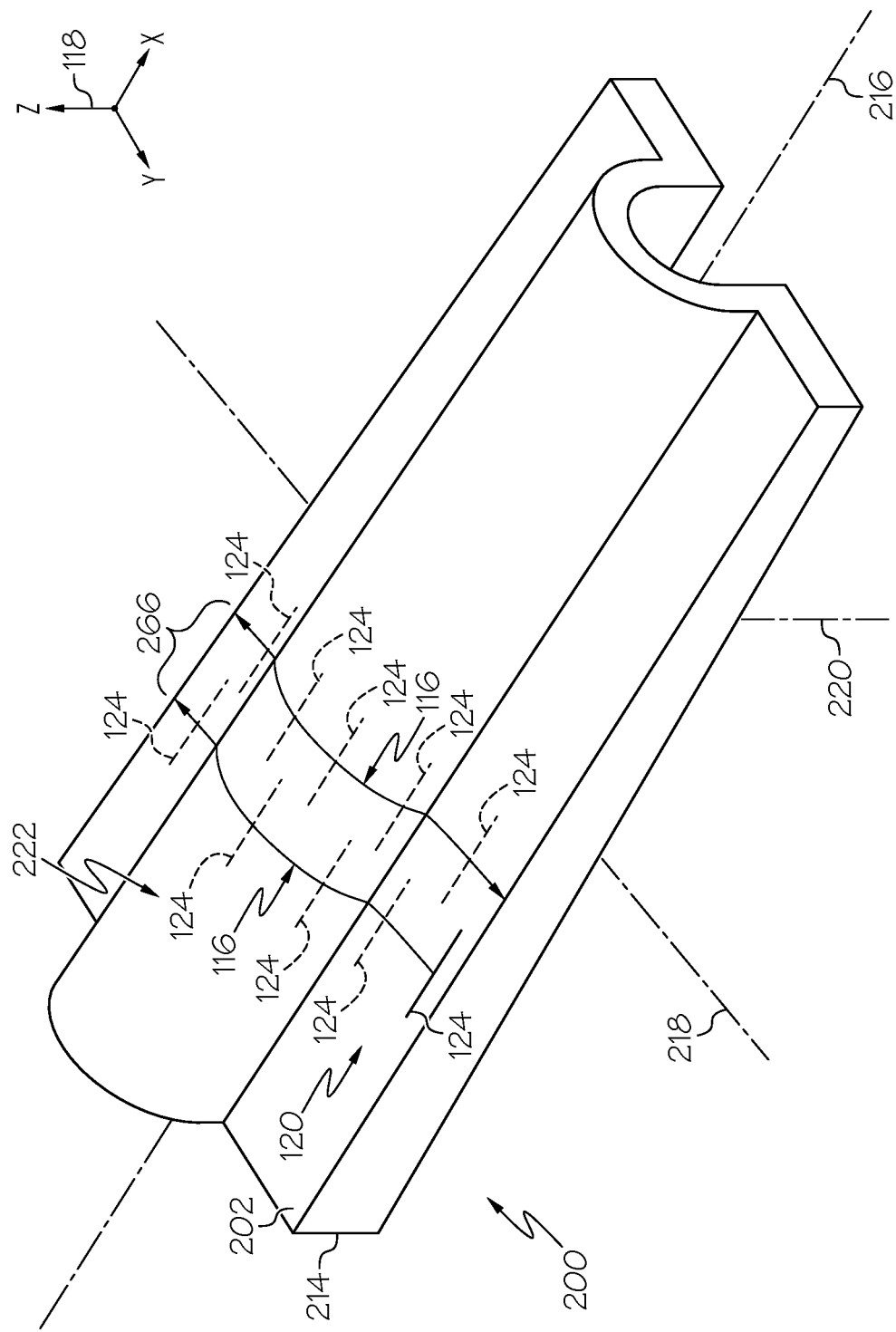
FIG. 16 is a schematic illustration of an example of the pattern of the laser light transmitted onto the surface of the structure along a scan path.

Referring to FIG. 16, in an example, according to the method 1000, the scan path 116 of the laser light 106 is perpendicular to the first axis 216 of the stiffener 214. In an example, the scan path 116 extends from one side of the stiffener 214 to an opposite side of the stiffener 214 and crosses the stiffener 214 perpendicular to the first axis 216. In FIG. 16, the line 124 of the laser light 106 at various subsequent positions on the surface 202, as the line 124 moves along the scan path 116, is depicted with broken lines. The scan path 116 is selected so that the line 124 of the laser light 106 traverses back and forth across the stiffener 214. In an example, the scan path 116 is selected so that the line 124 of the laser light 106 covers a portion of the surface 202 or the same area on the surface 202 more than once as the line 124 of the laser light 106 moves along the scan path 116. In an example, upon the line 124 of the laser light 106 reaching an outer extent of the scan path 116 (e.g., proximate to the side of the stiffener 214), the line 124 of the laser light 106 is moved along the first axis 216 by an index 266. The index 266 is selected so that the line 124 of the laser light 106 covers a portion of the surface 202 or the same area on the surface 202 more than once as the line 124 of the laser light 106 moves along the scan path 116.

Figure 17:
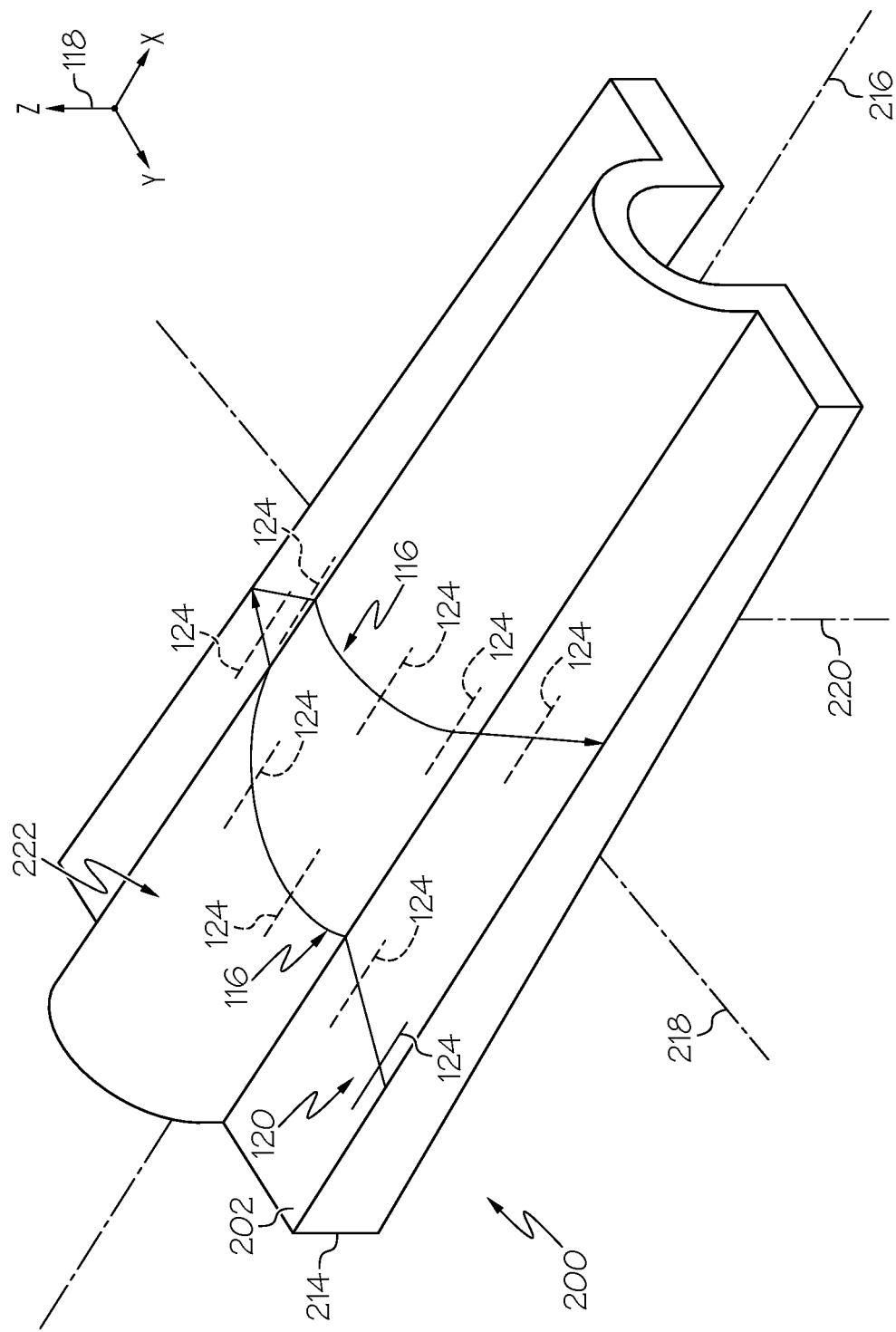
FIG. 17 is a schematic illustration of an example of the pattern of the laser light transmitted onto the surface of the structure along the scan path.

Referring to FIG. 17, in an example, according to the method 1000, the scan path 116 of the laser light 106 is oblique to the first axis 216 of the stiffener 214. In an example, the scan path 116 extends from one side of the stiffener 214 to an opposite side of the stiffener 214 and crosses the stiffener 214 oblique to the first axis 216. In FIG. 17, the line 124 of the laser light 106 at various subsequent positions on the surface 202, as the line 124 moves along the scan path 116, is depicted with broken lines. The scan path 116 is selected so that the line 124 of the laser light 106 traverses back and forth across the stiffener 214. In an example, the scan path 116 is selected so that the line 124 of the laser light 106 covers a portion of the surface 202 or the same area on the surface 202 more than once as the line 124 of the laser light 106 moves along the scan path 116.

In an example, the method 1000 includes a step of based on the three-dimensional model 246 of the surface 202, simulating the scan path 116 of the laser light 106 so that the difference value 256 of Z-coordinates of any two of the plurality of points 222 on the surface 202, which are located inclusively within the line 124 of the laser light 106, is less than or equal to the threshold value 254 as the line 124 of the laser light 106 moves across the surface 202 of the structure 200.

In an example, a simulation of the scan path 116 is generated using a software tool that enables simulation of a robot path in relation to the three-dimensional model 246 of the structure 200.

Accordingly, the laser ultrasound testing system 102 and method 1000 disclosed herein may enable rapid non-destructive testing of structures having various different cross-sectional shapes and/or surface profile shapes.

Figure 18:
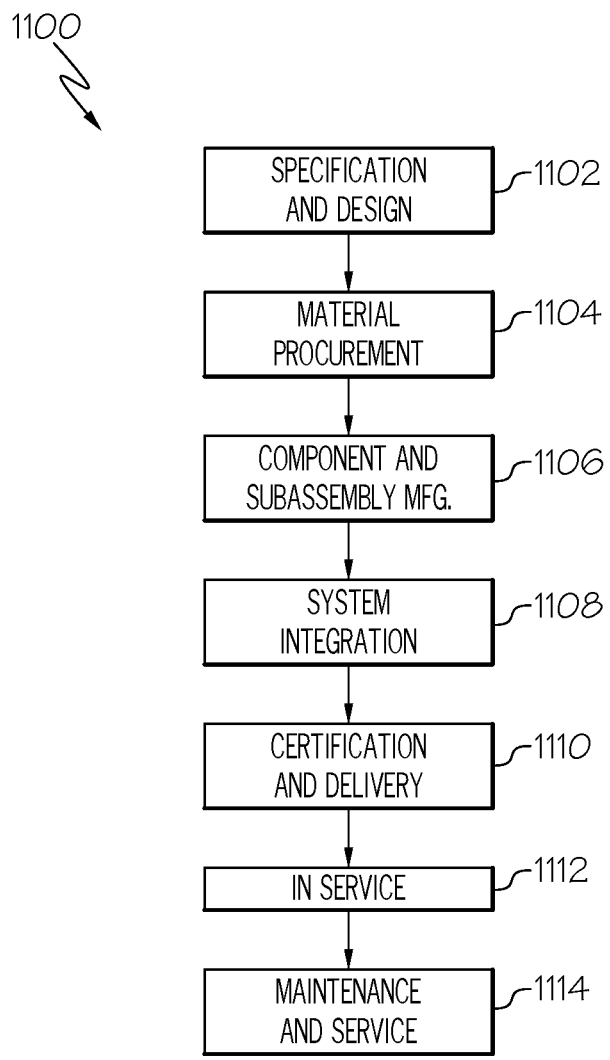
FIG. 18 is a flow diagram of an example aircraft production and service methodology.

Examples of the system 102 and method 1000 disclosed herein may find use in a variety of potential applications, particularly in the transportation industry, including for example, aerospace applications. Referring now to FIGS. 1 and 18, examples of the system 102 and method 1000 may be used in the context of an aircraft manufacturing and service method 1100, as shown in the flow diagram of FIG. 18, and the aircraft 1200, as shown in FIG. 1. Aircraft applications of the disclosed examples may include use of the system 102 for ultrasound testing of composite structures of the aircraft 1200.

As shown in FIG. 18, during pre-production, the illustrative method 1100 may include specification and design of the aircraft 1200 (Block 1102) and material procurement (Block 1104). During production of the aircraft 1200, component and subassembly manufacturing (Block 1106) and system integration (Block 1108) of the aircraft 1200 may take place. Thereafter, the aircraft 1200 may go through certification and delivery (Block 1110) to be placed in service (Block 1112). The disclosed system 102 and method 1000 may form a portion of component and subassembly manufacturing (Block 1106) and/or system integration (Block 1108). Routine maintenance and service may include modification, reconfiguration, refurbishment, etc. of one or more systems of the aircraft 1200.

Each of the processes of illustrative method may be performed or carried out by a system integrator, a third party, and/or an operator (e.g., a customer). For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

Examples of the system 102 and method 1000 shown or described herein may be employed during any one or more of the stages of the manufacturing and service method 1100 shown in the flow diagram illustrated by FIG. 18. For example, components or subassemblies corresponding to component and subassembly manufacturing (Block 1106) may be fabricated or manufactured in a manner similar to components or subassemblies produced while the aircraft 1200 is in service (Block 1112). Also, one or more examples of the system 102, the method 1000, or combinations thereof, may be utilized during system integration (Block 1108) and certification and delivery (Block 1110). Similarly, one or more examples of the system 102, the method 1000, or a combination thereof, may be utilized, for example and without limitation, while the aircraft 1200 is in service (Block 1112) and during maintenance and service (Block 1114).

The example of the aircraft 1200 (FIG. 1) is provided for purposes of illustration and is not meant to imply architectural limitations as to the manner in which different examples may be implemented. For example, the aircraft 1200 is shown as a commercial passenger aircraft, however, in other examples, the aircraft 1200 may be other types of aircraft, such as a private passenger aircraft, a cargo aircraft, a rotorcraft, an unmanned aerial vehicle, or other suitable types of aircraft.

Although the illustrative examples of the disclosed system 102 and method 1000 are described with respect to an aircraft, other examples may be applied to other types of platforms. The platform may be, for example, a mobile platform, a stationary platform, a land-based structure, an aquatic-based structure, or a space-based structure. More specifically, the platform may be a surface ship, a tank, a personnel carrier, a train, a spacecraft, a space station, a satellite, a submarine, an automobile, a manufacturing facility, a building, or other suitable platforms.

Further, examples of the disclosed system 102 and method 1000 may be applied to other types of composite structures. For example, composite structures other than platforms may be inspected using a laser ultrasound testing system. Composite structures other than platforms may include medical devices, prosthetic limbs, or any other desirable products.

Reference herein to "example" means that one or more feature, structure, element, component, characteristic and/or operational step described in connection with the example is included in at least one embodiment and or implementation of the subject matter according to the present disclosure. Thus, the phrases "an example," "another example," and similar language throughout the present disclosure may, but do not necessarily, refer to the same example. Further, the subject matter characterizing any one example may, but does not necessarily, include the subject matter characterizing any other example.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware that enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

Unless otherwise indicated, the terms "first," "second," etc. are used herein merely as labels, and are not intended to impose ordinal, positional, or hierarchical requirements on the items to which these terms refer. Moreover, reference to a "second" item does not require or preclude the existence of lower-numbered item (e.g., a "first" item) and/or a higher-numbered item (e.g., a "third" item).

As used herein, "coupled," "coupling," and similar terms refer to two or more elements that are joined, linked, fastened, connected, put in communication, or otherwise associated (e.g., mechanically, electrically, fluidly, optically, electromagnetically) with one another. In various examples, the elements may be associated directly or indirectly. As an example, element A may be directly associated with element B. As another example, element A may be indirectly associated with element B, for example, via another element C. It will be understood that not all associations among the various disclosed elements are necessarily represented. Accordingly, couplings other than those depicted in the figures may also exist.

As used herein, the term "approximately" represents a condition, an amount, or a value that is close to, but is not exactly, the stated condition, amount, or value that still performs the desired function or achieves the desired result. For example, the term "approximately" may refer to an amount or a value that is within less than 10% of, within less than 5% of, within less than 1% of, within less than 0.1% of, and within less than 0.01% of the stated amount or value.

As used herein, the term "substantially" may include exactly and similar, which is to an extent that it may be perceived as being exact. For illustrative purposes only, and not as a limiting example, the term "substantially" may be quantified as a variance of +/−5% from the exact or actual. For example, the phrase "A is substantially the same as B" may encompass conditions in which A is exactly the same as B, or where A is within a variance of +/−5% of B, or vice versa.

In FIGS. 2 and 7, referred to above, solid lines, if any, connecting various elements and/or components may represent mechanical, electrical, fluid, optical, electromagnetic and other couplings and/or combinations thereof. It will be understood that not all relationships among the various disclosed elements are necessarily represented. Accordingly, couplings other than those depicted in the block diagrams may also exist. Dashed lines, if any, connecting blocks designating the various elements and/or components represent couplings similar in function and purpose to those represented by solid lines; however, couplings represented by the dashed lines may either be selectively provided or may relate to alternative examples of the present disclosure. Likewise, elements and/or components, if any, represented with dashed lines, indicate alternative examples of the present disclosure. One or more elements shown in solid and/or dashed lines may be omitted from a particular example without departing from the scope of the present disclosure. Environmental elements, if any, are represented with dotted lines. Virtual (imaginary) elements may also be shown for clarity. Those skilled in the art will appreciate that some of the features illustrated in FIGS. 2 and 7 may be combined in various ways without the need to include other features described in FIGS. 2 and 7, other drawing figures, and/or the accompanying disclosure, even though such combination or combinations are not explicitly illustrated herein. Similarly, additional features not limited to the examples presented, may be combined with some or all of the features shown and described herein.

In FIGS. 11 and 18, referred to above, the blocks may represent operations and/or portions thereof and lines connecting the various blocks do not imply any particular order or dependency of the operations or portions thereof. Blocks represented by dashed lines indicate alternative operations and/or portions thereof. Dashed lines, if any, connecting the various blocks represent alternative dependencies of the operations or portions thereof. It will be understood that not all dependencies among the various disclosed operations are necessarily represented. FIGS. 11 and 18 and the accompanying disclosure describing the operations of the disclosed methods set forth herein should not be interpreted as necessarily determining a sequence in which the operations are to be performed. Rather, although one illustrative order is indicated, it is to be understood that the sequence of the operations may be modified when appropriate. Accordingly, modifications, additions and/or omissions may be made to the operations illustrated and certain operations may be performed in a different order or simultaneously. Additionally, those skilled in the art will appreciate that not all operations described need be performed.

Although various examples of the disclosed systems and methods have been shown and described, modifications may occur to those skilled in the art upon reading the specification. The present application includes such modifications and is limited only by the scope of the claims.

What is claimed is:

1. A method for testing a structure, having a variable surface profile, using laser ultrasound, the method comprising:
   determining an XYZ-coordinate of each one of a plurality of points on a surface of the structure relative to a reference frame, wherein a difference value of Z-coordinates between at least one of the plurality of points on the surface and at least another one of the plurality of points on the surface is greater than a threshold value;
   selecting a linearly arranged first set of the plurality of points on the surface in which the difference value of Z-coordinates of any two of the first set of the plurality of points is less than or equal to the threshold value;
   selecting a linearly arranged second set of the plurality of points on the surface in which the difference value of Z-coordinates of any two of the second set of the plurality of points is less than or equal to the threshold value;
   generating a scan path that intersects the first set of the plurality of points and the second set of the plurality of points;
   transmitting an array of laser light, configured to form ultrasonic waves in the structure and to detect a response to the ultrasonic waves, from an output of a transmitter in the form of a linear pattern of the laser light onto the surface of the structure;
   moving the array of the laser light across the surface along the scan path such that:
      the linear pattern of the laser light is positioned inclusively within the first set of the plurality of points and is positioned inclusively within the second set of the plurality of points as the array of the laser light moves along the scan path;
      the output of the transmitter is located at a constant offset distance from the surface in a Z-direction; and
      the array of the laser light, transmitted from the output of the transmitter, is directed onto the surface at a constant angle of projection;
   processing the response to the ultrasonic waves to evaluate the structure.

2. The method of claim 1, wherein the threshold value is less than or equal to one-eighth of an inch.

3. The method of claim 1, wherein:
   the array of the laser light is formed by a plurality of laser beams;
   the linear pattern of the laser light comprises a plurality of spots, formed on the surface by the plurality of laser beams, arranged linearly; and
   the linear pattern of the laser light has a length dimension, formed by the plurality of spots, and a width dimension, formed by a spot size of the plurality of spots.

4. The method of claim 1, further comprising:
   selecting a linearly arranged third set of the plurality of points on the surface in which the difference value of Z-coordinates of any two of the third set of the plurality of points is less than or equal to the threshold value; and
   generating the scan path that intersects the second set of the plurality of points and the third set of the plurality of points such that the line linear pattern of the laser light is positioned inclusively between within the third set of the plurality of points as the array of the laser light moves along the scan path.

5. The method of claim 1, further comprising adjusting a pose of the transmitter so that the output of the transmitter is located at the constant offset distance from the surface and that the array of the laser light, transmitted from the output of the transmitter, is directed onto the surface at the constant angle of projection as the linear pattern of the laser light moves across the surface along the scan path between the first set of the plurality of points and the second set of the plurality of points.

6. The method of claim 1, wherein:
   the structure comprises a stiffener of an aircraft;
   the stiffener comprises a longitudinal axis; and
   each one of the first set of the plurality of points and the second set of the plurality of points is parallel to the longitudinal axis of the stiffener.

7. The method of claim 6, wherein the scan path of the array of the laser light is perpendicular to the longitudinal axis of the stiffener.

8. The method of claim 6, wherein the scan path of the array of the laser light is oblique to the longitudinal axis of the stiffener.

9. The method of claim 1, further comprising:
   providing three-dimensional point cloud data of the surface of the structure;
   based on the three-dimensional point cloud data of the surface, determining the XYZ-coordinate of each one of the plurality of points on the surface relative to a structure reference frame; and
   aligning the structure reference frame with the reference frame.

10. The method of claim 9, further comprising:
    providing a three-dimensional model of the structure; and
    extracting the three-dimensional point cloud data of the surface from the three-dimensional model of the structure.

11. The method of claim 10, further comprising:
    capturing an image of the structure; and
    generating the three-dimensional model of the structure from the image of the structure.

12. The method of claim 10, further comprising, based on the three-dimensional model of the structure, simulating the scan path of the array of the laser light so that the difference value of Z-coordinates of any two of the linearly aligned set of points, located inclusively within the linear pattern of the laser light, is less than or equal to the threshold value as the linear pattern of the laser light moves across the surface of the structure.

13. The method of claim 1, further comprising, based on a three-dimensional model of the structure, simulating the scan path of the array of the laser light so that the linear pattern of the laser light is positioned inclusively within the first set of the plurality of points and is positioned inclusively within the second set of the plurality of points as the array of the laser light moves along the scan path.

14. The method of claim 3, wherein the first set of the plurality of points and the second set of the plurality of points are selected to have a linear dimension equal to or greater than the length dimension of the linear pattern of the laser light.

15. The method of claim 3, further comprising modifying the length dimension of the linear pattern of the laser light to be equal to or less than a linear dimension of the first set of the plurality of points and the second set of the plurality of points.

16. A laser ultrasound testing system for testing a structure having a variable surface profile in which a difference value of Z-coordinates between at least one of a plurality of points on the surface and at least another one of the plurality of points on the surface is greater than a threshold value, the laser ultrasound testing system comprising:
   a laser source configured to emit laser light;
   a transmitter optically coupled with the laser source and configured to transmit an array of the laser light from an output of the transmitter in the form of a linear patter of the laser light onto a surface of the structure, wherein the array of the laser light is configured to form ultrasonic waves in the structure and to detect a response to the ultrasonic waves;
   a movement mechanism coupled to the transmitter and configured to move the transmitter relative to the structure; and
   a computer configured to:
      determine an XYZ-coordinate of each one of the plurality of points on the surface relative to a reference frame;
      select a linearly arranged first set of the plurality of points on the surface in which the difference value of Z-coordinates of any two of the first set of the plurality of points is less than or equal to the threshold value;
      select a linearly arranged second set of the plurality of points on the surface in which the difference value of Z-coordinates of any two of the second set of the plurality of points is less than or equal to the threshold value;
      generate the scan path that intersects the first set of the plurality of points and the second set of the plurality of points;
      control the movement mechanism so that the array of the laser light is moved across the surface along the scan path such that:
         the linear pattern of the laser light is positioned inclusively within the first set of the plurality of points and is positioned inclusively within the second set of the plurality of points when the array of the laser light is moved along the scan path;
         the output of the transmitter is located at a constant distance from the surface; and
         the array of the laser light, transmitted from the output of the transmitter, is directed at a constant angle of projection onto the surface; and
      process the response to the ultrasonic waves to evaluate the structure.

17. The laser ultrasound testing system of claim 16, wherein the computer is further configured to:
   extract three-dimensional point cloud data of the surface from a three-dimensional model of the structure; and
   based on the three-dimensional point cloud data of the surface, determine the XYZ-coordinate of each one of the plurality of points on the surface relative to the reference frame.

18. The laser ultrasound testing system of claim 17, further comprising a sensor configured to capture an image of the structure, wherein the computer is further configured to generate the three-dimensional model of the structure from the image of the structure.

19. The laser ultrasound testing system of claim 17, wherein, based on the three-dimensional point cloud data of the surface, the computer is further configured to simulate the scan path of the array of the laser light so that the difference value of Z-coordinates of any two of the linearly aligned set of the points, located inclusively within the linear pattern of the laser light, is less than or equal to the threshold value as the linear pattern of the laser light moves across the surface of the structure.

20. The laser ultrasound testing system of claim 16, wherein the computer is further configured to:
   simulate the scan path of the array of the laser light based on a three-dimensional model of the structure so that the linear pattern of the laser light is positioned inclusively within the first set of the plurality of points and is positioned inclusively within the second set of the plurality of points as the array of the laser light moves along the scan path; and
   modify a length dimension of the linear pattern of the laser light to be equal to or less than a linear dimension of the first set of the plurality of points and the second set of the plurality of points.

* * * * *